(12) United States Patent
Lee et al.

(10) Patent No.: US 12,514,063 B2
(45) Date of Patent: Dec. 30, 2025

(54) DISPLAY DEVICE

(71) Applicant: LG Display Co., Ltd., Seoul (KR)

(72) Inventors: Eun Hyung Lee, Paju-si (KR); Moon Sung Kil, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 389 days.

(21) Appl. No.: 18/357,058

(22) Filed: Jul. 21, 2023

(65) Prior Publication Data
US 2024/0032335 A1 Jan. 25, 2024

(30) Foreign Application Priority Data
Jul. 25, 2022 (KR) ........................ 10-2022-0092028

(51) Int. Cl.
*H10K 59/121* (2023.01)
*H10K 59/122* (2023.01)
*H10K 59/131* (2023.01)
*H10K 59/35* (2023.01)
*H10K 59/65* (2023.01)

(52) U.S. Cl.
CPC ......... *H10K 59/121* (2023.02); *H10K 59/122* (2023.02); *H10K 59/131* (2023.02); *H10K 59/352* (2023.02); *H10K 59/353* (2023.02); *H10K 59/65* (2023.02)

(58) Field of Classification Search
CPC .... H10K 59/121; H10K 59/353; H10K 59/65; H10K 59/122; H10K 59/352
USPC .................................................. 313/498–512
See application file for complete search history.

(56) References Cited

U.S. PATENT DOCUMENTS

| | | |
|---|---|---|
| 8,916,859 B2 | 12/2014 | Kim et al. |
| 2013/0001601 A1* | 1/2013 | Lee ...................... H10H 20/856 |
| | | 257/E33.072 |
| 2014/0042400 A1 | 2/2014 | Kim et al. |
| 2016/0118449 A1 | 4/2016 | Sato et al. |
| 2017/0338292 A1* | 11/2017 | Choi .................. H10K 59/8792 |
| 2020/0373520 A1* | 11/2020 | Kim ..................... H10K 59/878 |
| 2021/0226169 A1* | 7/2021 | Yu ........................ H10K 59/122 |
| 2022/0352267 A1* | 11/2022 | Baek .................... H10K 59/122 |
| 2023/0091271 A1* | 3/2023 | Ohshima .............. H10K 59/122 |
| | | 257/91 |

FOREIGN PATENT DOCUMENTS

KR 10-1921965 B1 11/2018

* cited by examiner

*Primary Examiner* — Christopher M Raabe
(74) *Attorney, Agent, or Firm* — Fenwick & West LLP

(57) ABSTRACT

A display device and a method for manufacturing the display device are provided. The display device comprises a substrate including a first light-emitting portion and a second light-emitting portion spaced apart from each other, a reflective layer spaced apart from each of the first and second light-emitting portions and surrounding the second light-emitting portion, a first light-emitting element including a first light-emitting layer in the first light-emitting portion, and a second light-emitting element including a second light-emitting layer in the second light-emitting portion, wherein the second light-emitting layer emitting light having a wavelength different from light emitted from the first light-emitting layer.

20 Claims, 13 Drawing Sheets

DISPLAY DEVICE

CROSS-REFERENCE TO RELATED APPLICATION

This application claims the benefit of Korean Patent Application No. 10-2022-0092028, filed on Jul. 25, 2022, which is hereby incorporated by reference as if fully set forth herein.

FIELD OF THE INVENTION

The disclosure relates to a display device, and more particularly, to a display device that includes a reflective layer to prevent light generated from a light-emitting portion from being transmitted to a sensor unit to thereby improve sensing sensitivity and reliability.

DISCUSSION OF THE RELATED ART

A light-emitting display device that does not require a separate light source and realizes compactness and clear color has been considered as a competitive application.

Meanwhile, light-emitting display devices are applied to various display devices such as televisions, cellular phones, electronic books, monitors, and laptop computers. In addition, a display device is combined with a sensor such as a camera and is used to perform display on a screen, or to check and edit a captured image.

SUMMARY OF THE INVENTION

Accordingly, the present disclosure is directed to a display device that substantially obviates one or more problems due to the limitations and disadvantages of the related art.

In a display device, there is a demand to increase an active area of the display device by reducing an outer area.

In response to this demand, a sensor may be formed to overlap the active area instead of the outer area.

In this case, the sensitivity of the sensor may decrease when light is transmitted from a light-emitting portion to the sensor. Therefore, it is necessary to control the emission of light from the light-emitting portion to the sensor.

Additional advantages, objects, and features of the disclosure will be set forth in part in the description which follows and in part will become apparent to those having ordinary skill in the art upon examination of the following, or may be learned from practice of the disclosure. The objectives and other advantages of the disclosure may be realized and attained by the structure particularly pointed out in the written description and claims hereof as well as the appended drawings.

The disclosure provides a display device that can improve the sensitivity of a camera or sensor by changing the shape of an active area where a camera or sensor is overlapped.

In addition, the present disclosure provides a display device that includes a reflective layer around a light-emitting portion having an organic layer having relatively delayed rising and falling operations so that light generated by the organic layer is emitted upward from the reflective layer to avoid the effect of the light of the organic layer having the delay characteristics on the operation of the sensor disposed below the substrate and thereby improve sensitivity of the sensor.

To achieve these objects and other advantages and in accordance with the purpose of the disclosure, as embodied and broadly described herein, a display device according to an exemplary embodiment of the present disclosure includes a substrate having a first light-emitting portion and a second light-emitting portion spaced apart from each other, a reflective layer spaced apart from each of the first and second light-emitting portions and surrounding the second light-emitting portion, a first light-emitting element including a first light-emitting layer in the first light-emitting portion, and a second light-emitting element including a second light-emitting layer emitting light of a wavelength different from that of the first light-emitting layer in the second light-emitting portion.

In another aspect of the present disclosure, a light-emitting display device includes a substrate having an active area and a non-active area surrounding the active area, the active area including a first area overlapping a sensor unit and a second area not overlapping the sensor unit, a bank defining a first light-emitting portion, a second light-emitting portion, and a third light-emitting portion spaced apart from each other in the first area and the second area, and a reflective layer formed in the bank in the first area and spaced apart from the first to the third light-emitting layers, while surrounding the second light-emitting layer.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate embodiment(s) of the disclosure and together with the description serve to explain the principle of the disclosure. In the drawings.

DETAILED DESCRIPTION OF THE INVENTION

Figure 1:
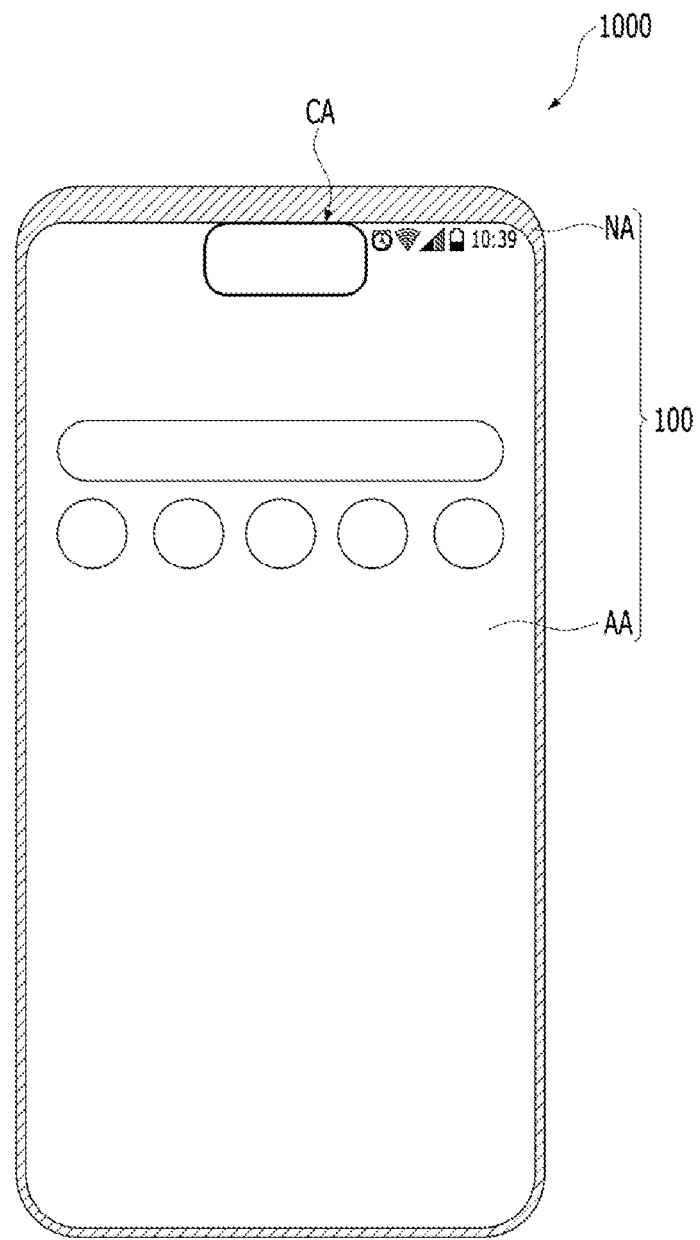
FIG. 1 is a plan view illustrating a display device of the present disclosure.

Reference will now be made in detail to preferred embodiments of the present disclosure, examples of which are illustrated in the accompanying drawings. Wherever possible, the same reference numbers will be used throughout the drawings to refer to the same or like parts. In the following description of the present disclosure, detailed descriptions of known functions and configurations incorporated herein will be omitted when the same may obscure the subject matter of the present disclosure. In addition, the names of elements used in the following description are selected in consideration of clarity of description of the specification, and may differ from the names of elements of actual products.

The shapes, sizes, proportions, angles, numbers, etc. disclosed in the drawings for describing the embodiments of the present disclosure are illustrative, and thus the present disclosure is not limited to the illustrated elements. The same reference symbols refer to the same elements throughout the specification. In addition, in describing the present disclosure, when it is determined that a detailed description of related known technology may unnecessarily obscure the subject matter of the present disclosure, a detailed description thereof will be omitted. When "including", "having", "consisting", etc. are used in this specification, other parts may also be present, unless "only" is used. When an element is expressed in the singular, the case including the plural is included unless explicitly stated otherwise.

In interpreting an element, it is to be interpreted as including an error range even when there is no separate explicit description thereof.

In the case of a description of a positional relationship, for example, when a positional relationship between two parts is described using "on", "above", "below", "next to", etc., one or more other parts may be located between the two parts, unless "immediately" or "directly" is used.

In the case of a description of a temporal relationship, when a temporal precedence relationship is described using "after", "subsequent to", "next", "before", etc., the case of a discontinuous relationship may be included, unless "immediately" or "directly" is used.

Although "first", "second", etc. are used to describe various elements, these elements are not limited by these terms. These terms are merely used to distinguish one element from another. Accordingly, a first element mentioned below may be a second element within the spirit of the present disclosure.

Respective features of the various embodiments of the present disclosure may be partially or entirely combined or associated with each other, various forms of interlocking and driving are technically possible, and respective embodiments may be implemented independently of each other, or may be implemented in association with each other.

Figure 2:
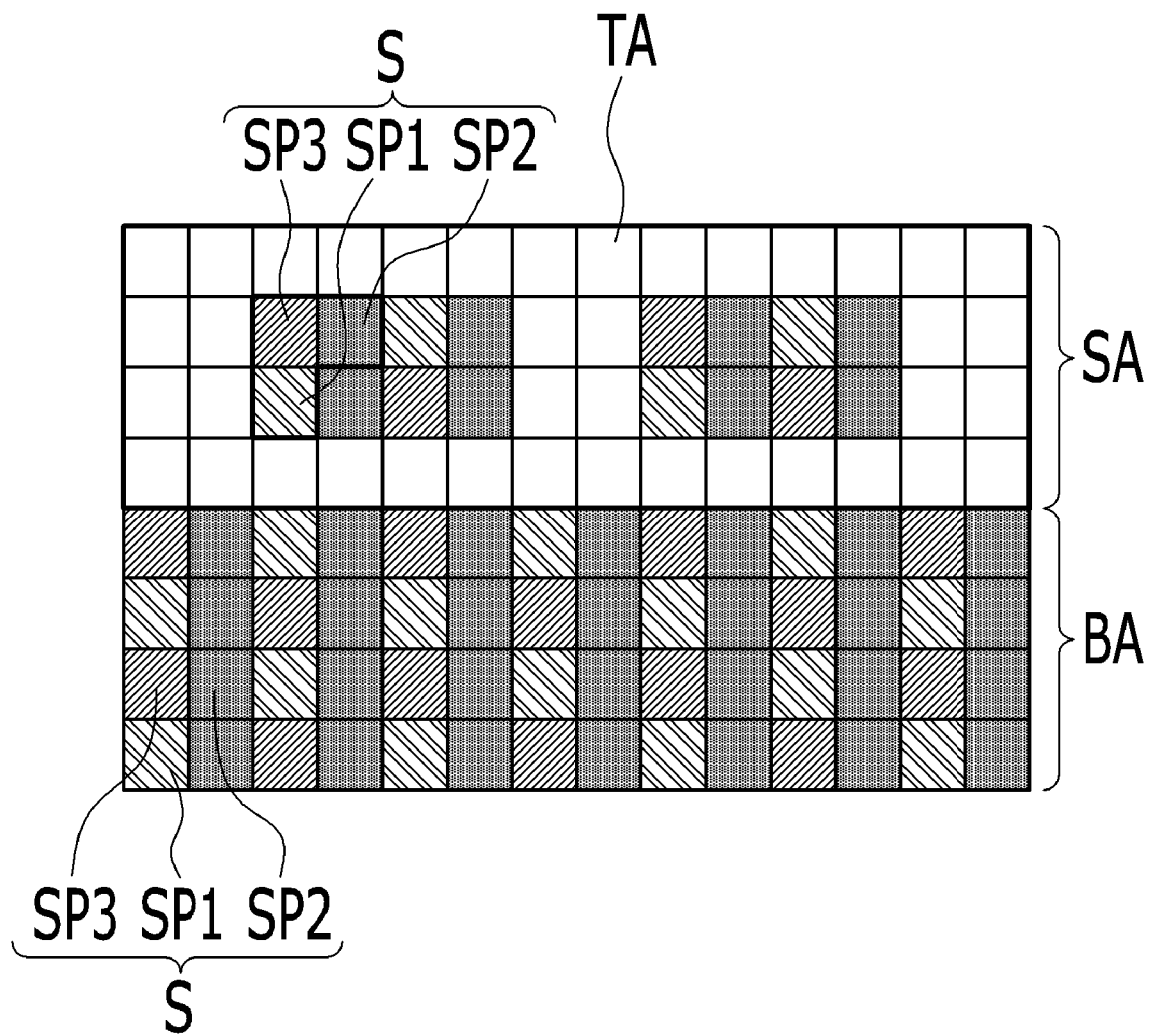
FIG. 2 is an enlarged view illustrating a configuration of the area CA of FIG. 1 in the display device according to the present disclosure.

FIG. 1 is a plan view illustrating a display device of the present disclosure and FIG. 2 is an enlarged view illustrating a configuration of the area CA of FIG. 1 according to an exemplary embodiment of the present disclosure.

As shown in FIG. 1, the display device 1000 of the present disclosure includes a substrate 100 divided into an active area AA in which a plurality of sub-pixels are arranged and a non-active area NA defined by an outer periphery surrounding the active area AA.

In the display device 1000, the upper surface of the non-active area NA of the substrate 100, the side surfaces of the substrate 100, and the lower surface of the substrate 100 may be protected by a case structure surrounding the outer periphery of the substrate 100. In some cases, the case structure may be omitted from the non-active area NA of the substrate 100. A black ink or color ink may be provided without the case structure in the non-active area NA of the substrate 100, to prevent the structure of the black ink or color ink formation area from being visible from the outside and to prevent the phase reflected by the structure on the substrate 100 from being visible.

An actual image is displayed in the active area AA of the substrate 100. For example, display icons continuously showing time information and various information about the current state of the display device 1000 may be observed in the upper right part of the active area AA of the substrate 100, and certain icons may be displayed on the initial screen. The number or shape of display icons appearing in the active area AA, and the icons in the initial state may be varied and may be omitted in some cases.

Meanwhile, in the display device 1000 of the present disclosure, the sensor unit may overlap the substrate 100 in a partial area CA of the active area AA. When the sensor unit corresponds to the partial area CA in the active area AA, the sensor unit functions as both a sensor and a display to minimize the non-active area without increasing the non-active area for the sensor unit.

The sensor unit functions to emit electromagnetic waves to an object outside the display device 1000 and to sense electromagnetic waves obtained by reflection. For example, the sensor unit may include an image sensor configured to collect and record images, an infrared sensor configured to emit infrared rays to a target corresponding to the display device 1000 and to detect reflected infrared information, and a UV sensor configured to radiate ultraviolet rays to the outside and sense the same from the outside. Further, in addition to the listed sensors, the sensor unit may include a sensor having a different wavelength band for emitting and irradiating light to a target from a wavelength band for sensing light. The image sensor may be replaced by a camera. When a user wears the display device 1000 in a wearable form, the sensor unit may directly irradiate or emit electromagnetic waves to the skin of the user and sense the reflected information.

The sensor unit is provided on the lower side of the substrate 100, a viewer can see an image on the upper side of the substrate 100, and information of an object observed can be obtained from the sensor unit on the lower side of the substrate 100. That is, the sensor unit may be disposed on the lower side of the substrate 100 opposite to the surface of the substrate 100, on which an array is formed, and may come into contact with the lower side of the substrate 100, or in some cases, may also be provided in the display device spaced apart by a predetermined distance from the lower side of the substrate 100.

As shown in FIG. 2, in the display device according to an exemplary embodiment of the present disclosure, the area CA of FIG. 1 includes a first area SA of the substrate 100 overlapping the sensor unit, and a second area BA, which is a normal active area of the substrate 100 adjacent to the sensor unit. The first area SA of the substrate 100 that overlaps with the sensor unit has a lowered arrangement density of the pixels S, compared to the second area BA of the substrate 100 that does not overlap with the sensor unit, and includes a transmissive portion TA to improve the sensitivity of the sensor unit. That is, the sensitivity of the sensor unit may be improved by disposing the transmissive portion TA capable of maintaining transparency, without forming any wire and thin film transistor, in the area where the substrate 100 overlaps the sensor unit.

Meanwhile, the pixel S may include first to third sub-pixels SP1, SP2, and SP3 emitting light of different colors. The first to third sub-pixels SP1, SP2, and SP3 may be repeatedly arranged in an identical shape in a row or column, and as shown in FIG. 2, in odd-numbered columns among two adjacent pixel columns, the first sub-pixel SP1 and the third sub-pixel SP3 may be alternately arranged and in even-numbered columns, the second sub-pixels SP2 may be continuously arranged. The alternating arrangement of the first sub-pixel and the third sub-pixel in the $N^{th}$ (N being a natural number) odd column and the $(N+1)_{th}$ odd column may be opposite to each other. That is, in the first odd-numbered column, the first sub-pixel SP1 and the third sub-pixel SP3 may be alternately arranged, whereas, in the second odd-numbered column, the third sub-pixel SP3 and the first sub-pixel SP1 may be alternately arranged. Such symmetric inversion has an advantage of mitigating color shift when the viewing angle changes.

Meanwhile, arrangements of even-numbered columns and odd-numbered columns in FIG. 2 are interchanged. In other words, the second sub-pixels SP2 are disposed in odd-numbered columns, and the first sub-pixels SP1 and third sub-pixels SP3 are alternately disposed in even-numbered columns. Similarly, such an arrangement may have an effect of mitigating color shift when the viewing angle changes.

Sub-pixels having a light-emitting color having a higher weight in representing white luminance may be second sub-pixels SP2 continuously arranged in a column. For example, the second sub-pixels SP2 may be green sub-pixels. In this case, for example, one of the first sub-pixel SP1 and the third sub-pixel SP3 may be a red sub-pixel and the other may be a blue sub-pixel, but is not limited thereto.

When sub-pixels emitting light of a specific color have a high weight in representing white luminance, as shown in FIG. 2, they may be continuously arranged in a column. The first to third sub-pixels SP1, SP2, and SP3 are not limited to a combination of red, green, and blue colors and may have other color combinations as long as white is obtained in combination. In another example, the first to third sub-pixels SP1, SP2, and SP3 may be cyan, magenta, and yellow sub-pixels.

Figure 3:
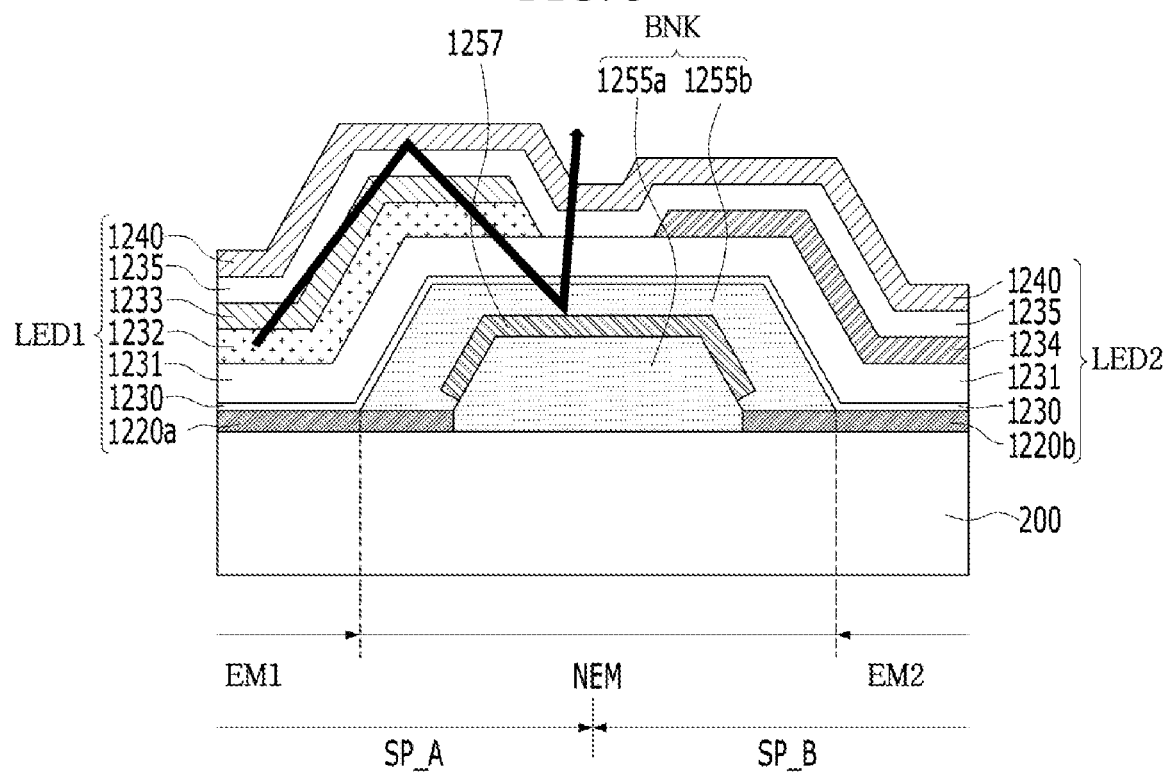
FIG. 3 is a cross-sectional view illustrating the boundary between adjacent sub-pixels in a display device according to a first embodiment of the present disclosure.

Each of the first to third sub-pixels SP1, SP2, and SP3 includes a light-emitting portion (see EM1 and EM2 in FIG. 3) and a non-light-emitting portion surrounding the light-emitting portion (see NEM in FIG. 3). Non-light-emitting portions NEMs of adjacent sub-pixels are connected and the non-light-emitting portions NEM are arranged in the form of a matrix when viewed from the entire area of the active area AA of the substrate 100, and as shown in FIG. 3, a bank BNK may be, for example, disposed in the non-light-emitting portion NEM, and the bank BNK surrounds the light-emitting portion EM.

The first to third sub-pixels SP1, SP2, and SP3 may be distinguished from each other at least by light-emitting layers (represented by reference numerals "1233" and "1231" in FIG. 3) overlapping the light-emitting portion.

Hereinafter, the configuration of the display device according to a first embodiment of the present disclosure will be described.

FIG. 3 is a cross-sectional view illustrating the boundary between adjacent sub-pixels in the display device according to the first embodiment of the present disclosure.

As shown in FIG. 3, the display device according to the first embodiment of the present disclosure includes a substrate having a first light-emitting portion EM1 and a second light-emitting portion EM2 spaced apart from each other, a reflective layer 1257 spaced apart from each of the first and second light-emitting portions EM1 and EM2, and surrounding the second light-emitting portion EM2, a first light-emitting element LED1 including a first light-emitting layer 1233 in the first light-emitting portion EM1, and a second light-emitting element LED2 including a second light-emitting layer 1234 emitting light of a wavelength different from that of the first light-emitting layer 1233 in the second light-emitting portion EM2.

In the display device according to the first embodiment of the present disclosure, the reflective layer 1257 is provided around the first light-emitting portion EM1 so that, although the light emitted from the first light-emitting layer 1233 of the first light-emitting element LED1 is emitted toward the non-light-emitting portion, it is reflected by the reflective layer 1257 and transferred upward, rather than being transmitted to the lower side of the substrate 200. Therefore, even if a thin film transistor or a separate sensor unit is provided below the first and second light-emitting elements LED1 and LED2 of the substrate 200, the influence by light travelling in a direction opposite to the light-emitting direction can be prevented.

As shown in FIG. 3, the reflective layer 1257 is disposed in the non-light-emitting portion NEM between the first and second light-emitting portions EM1 and EM2, so that the influence of the light emitted downward from the second light-emitting portion EM2 as well as the influence of the light emitted downward from the first light-emitting portion EM1 can be prevented.

The reflective layer 1257 may be provided in the bank BNK. Any material may be used as the material of the reflective layer 1257 as long as it can reflect the light incident on the surface and return the light to the incident side. The reflective layer 1257 may include a reflective metal. In some cases, the reflective layer 1257 may include both a reflective metal and a reflective resin. For example, the reflective metal may be any one of aluminum (Al), silver (Ag), gold (Au), and platinum (Pt), or an alloy including at least one of the metals.

FIG. 3 shows an example in which the bank BNK has a two-layer structure of a first layer 1255a and a second layer 1255b. For example, the reflective layer 1257 may be provided between the first layer 1255a and the second layer 1255b.

The first layer 1255a of the bank BNK is provided between the anodes 1220a and 1220b of the adjacent sub-pixels SP_A and SP_B, and the reflective layer 1257 is provided on the top and side surfaces of the first layer 1255a. When the reflective layer 1257 includes a reflective metal, the reflective layer 1257 may be spaced apart from the anodes 1220a and 1220b disposed thereunder by a predetermined distance from the side surface of the first layer 1255a of the bank BNK such that it does not contact the anodes 1220a and 1220b of the adjacent sub-pixels SP_A and SP_B to provide independent driving of the adjacent sub-pixels SP_A and SP_B. When the reflective layer 1257 is formed of an insulating material, the edge of the reflective layer 1257 may contact the anodes 1220a and 1220b.

Also, the second layer 1255b of the bank BNK is formed to cover the first layer 1255a on which the reflective layer 1257 is formed. In this case, the surface of the second layer 1255b of the bank BNK has an even upper surface and a uniform side slope without being affected by the surface morphology of the reflective layer 1257. In this way, when the second layer 1255b of the bank BNK is formed so as to cover the reflective layer 1257, the common layers formed along the side and top surfaces of the bank BNK between adjacent sub-pixels and the cathode are formed on an even surface, it is possible to prevent occurrence of voids or short circuit at the edge of the reflective layer 1257. When the second layer 1255b of the bank BNK is not formed on the reflective layer 1257, the void at the edge of the reflective layer 1257 is exposed, which may cause non-uniform formation of the common layer or cathode deposited after the bank BNK is formed and result in an increase in resistance and deterioration in reliability.

Here, the thickness of the second layer 1255b of the bank BNK is greater than that of the reflective layer 1257, thereby preventing the effect of the step depending on whether or not the reflective layer 1257 is formed on the surface of the first layer 1255a of the bank BNK. In addition, since the second layer 1255b is formed to a thickness sufficient to cover the void between the side of the first layer 1255a and the reflective layer 1257, the side of the second layer 1255b may cover the edges of the anodes 1220a and 1220b. The exposed portion of the second layer 1255b of the bank BNK may define the light-emitting portion of each sub-pixel.

Meanwhile, as shown in FIG. 3, the first light-emitting element LED1 of the first sub-pixel SP-A of the adjacent sub-pixels may, for example, include an anode 1220a, a hole injection layer 1230, a hole transport layer 1231, an auxiliary hole transport layer 1232, a first light-emitting layer 1233, an electron transport layer 1235, and a cathode 1240. In addition, the second light-emitting element LED2 of the second sub-pixel SP-B includes an anode 1220b, a hole injection layer 1230, a hole transport layer 1231, a second light-emitting layer 1234, an electron transport layer 1235, and a cathode 1240.

The hole injection layer 1230, the hole transport layer 1231, and the electron transport layer 1235 in the first and second sub-pixels SP-A and SP-B are common to the light-emitting portions EM1 and EM2 and the non-light-emitting portion NEM, and the hole injection layer 1230, the hole transport layer 1231, and the electron transport layer 1235 are common to a plurality of sub-pixels, and thus are referred to as "common layers". The hole injection layer 1230 lowers the energy barrier to smoothly inject holes from the anode, the hole transport layer 1231 transports holes to the light-emitting layers 1233 and 1234, and the electron transport layer 1235 transports electrons to the light-emitting layers 1233 and 1234. An additional common layer such as an electron blocking layer or a hole blocking layer may be further provided so that carriers such as electrons and holes are concentrated in the light-emitting layers 1233 and 1234 to form excitons.

Meanwhile, the auxiliary hole transport layer 1232 is shown in the first sub-pixel SP1 of FIG. 3, which functions to adjust the vertical position where optimal light emission occurs based on the resonance between the anode 1220a and the cathode 1240.

The auxiliary hole transport layer 1232 may be thicker in a sub-pixel emitting light of a relatively long wavelength.

For example, the auxiliary hole transport layer may not be included in the blue sub-pixel, but is not limited thereto. In the example illustrated in FIG. 3, for example, the first sub-pixel SP_A may be a sub-pixel emitting green or a sub-pixel emitting red, and the second sub-pixel SP_B may be a blue sub-pixel, but is not limited thereto.

In the display device of the present disclosure, the anodes 1220a and 1220b of the first light-emitting element LED1 and the second light-emitting element LED2 provided in the first sub-pixel SP_A and the second sub-pixel SP_B are reflective electrodes. In addition, the cathode 1240 may be a transmissive electrode or a semi-transmissive electrode and may emit light upward. Here, the reflective electrode constituting the anodes 1220a and 1220b may be aluminum, silver, gold, platinum, or an alloy including any one of the metals. In addition, the anodes 1220a and 1220b may be formed in a multilayer structure in which a reflective electrode and a transparent electrode are stacked on top or bottom, or transparent electrodes are provided on top and bottom of the reflective electrode. The cathode 1240 is, for example, a transparent oxide metal such as ITO, IZO, or ITZO, or a thin semi-transmissive metal including at least one of silver (Ag), magnesium (Mg), ytterbium (Yb), and strontium (Sr). In the light-emitting portions EM1 and EM2, the light is directed to the cathode 1240 due to the reflectivity of the anodes 1220a and 1220b so that the light is emitted to the upper side of the substrate 200, and in the non-light-emitting portion NEM, the reflective layer 1257 provided on the surface of the first layer 1255a of the bank BNK reflects the light traveling in the opposite direction to the light-emitting direction, upward as much as possible, to prevent light generated by the light-emitting elements LED1 and LED2 of the sub-pixels SP_A and SP_B from being directed to the lower side of the substrate 200.

In the light-emitting elements LED1 and LED2 of the sub-pixels SP_A and SP_B, the light-emitting layers 1233 and 1234 may be formed on at least the light-emitting portions EM1 and EM2, and the light-emitting portions EM1 and EM2 may also be formed in consideration of the process margin during deposition on a part of the periphery of the non-light-emitting portion NEM. As shown in the drawings, the light-emitting layer may overlap not only the side surface of the second layer 1255b of the bank BNK but also a part of the upper surface thereof.

In the display device of the present disclosure, the reflective layer 1257 is provided in the bank BNK to correspond to the non-light-emitting portion between adjacent sub-pixels, so that the light emitted from the light-emitting layers 1233 and 1234 is directed upward to the light-emitting elements LED1 and LED2 to prevent abnormal operation of the thin film transistor or the sensor unit provided under the light-emitting elements LED1 and LED2.

The reflective layer 1257 of the display device of the present disclosure may be provided between different sub-pixels or may be provided only in the sensor part of the active area AA.

In addition, the reflective layer 1257 may be provided around the light-emitting portion of the specific sub-pixel depending on the difference in the characteristics of the light-emitting portion of the sub-pixels.

Hereinafter, a display device according to another exemplary embodiment of the present disclosure will be described.

Figure 4:
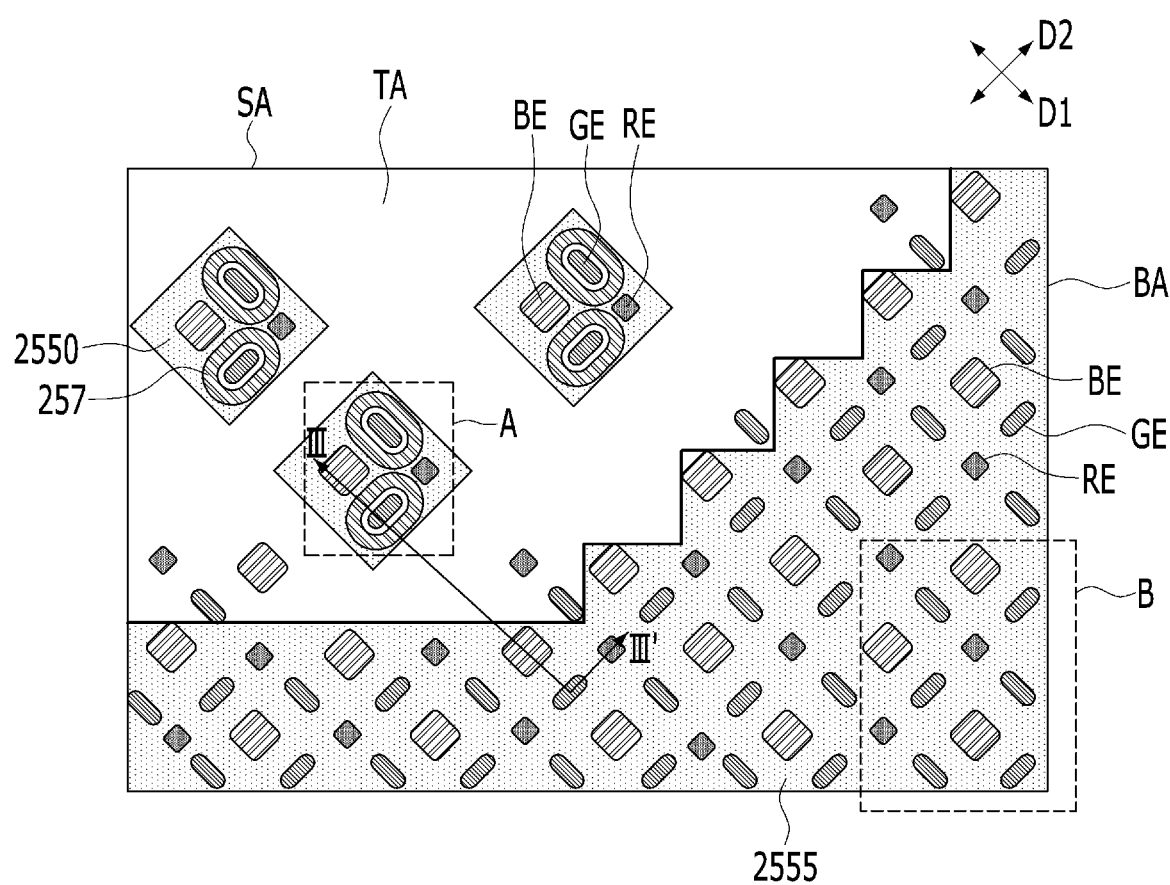
FIG. 4 is an enlarged view illustrating a configuration of the area CA of FIG. 1 in a display device according to a second exemplary embodiment of the present disclosure.
Figure 5A:
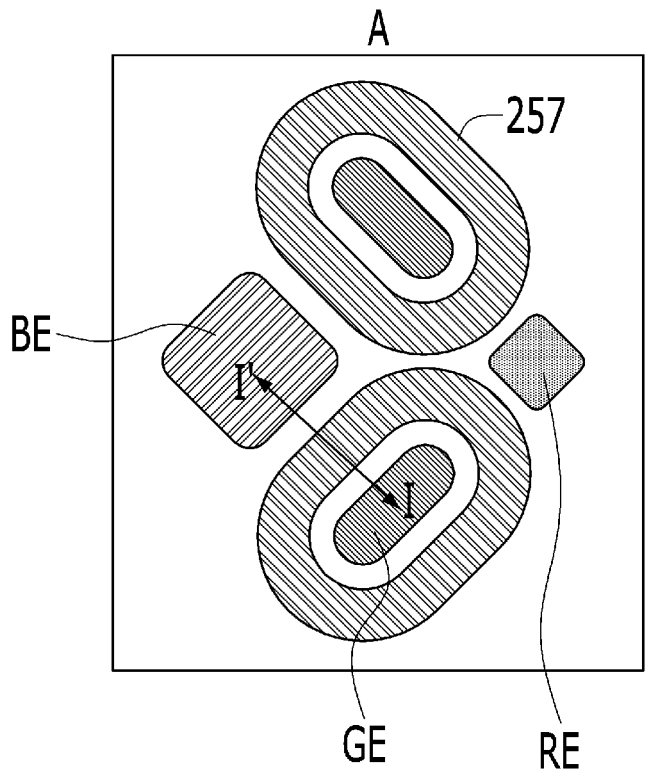
FIG. 5A is an enlarged view of area A in FIG. 4.

FIG. 4 is an enlarged view illustrating a configuration of the area CA of FIG. 1 in a display device according to a second exemplary embodiment of the present disclosure, FIG. 5A is an enlarged view of area A in FIG. 4, and FIG.

Figure 6A:
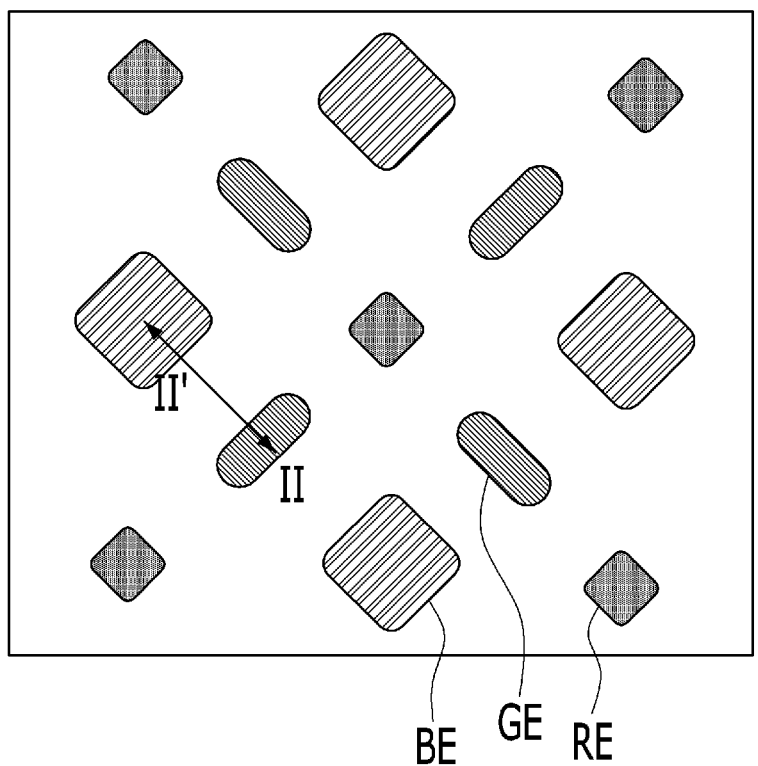
FIG. 6A is an enlarged view of area B in FIG. 4.
Figure 6B:
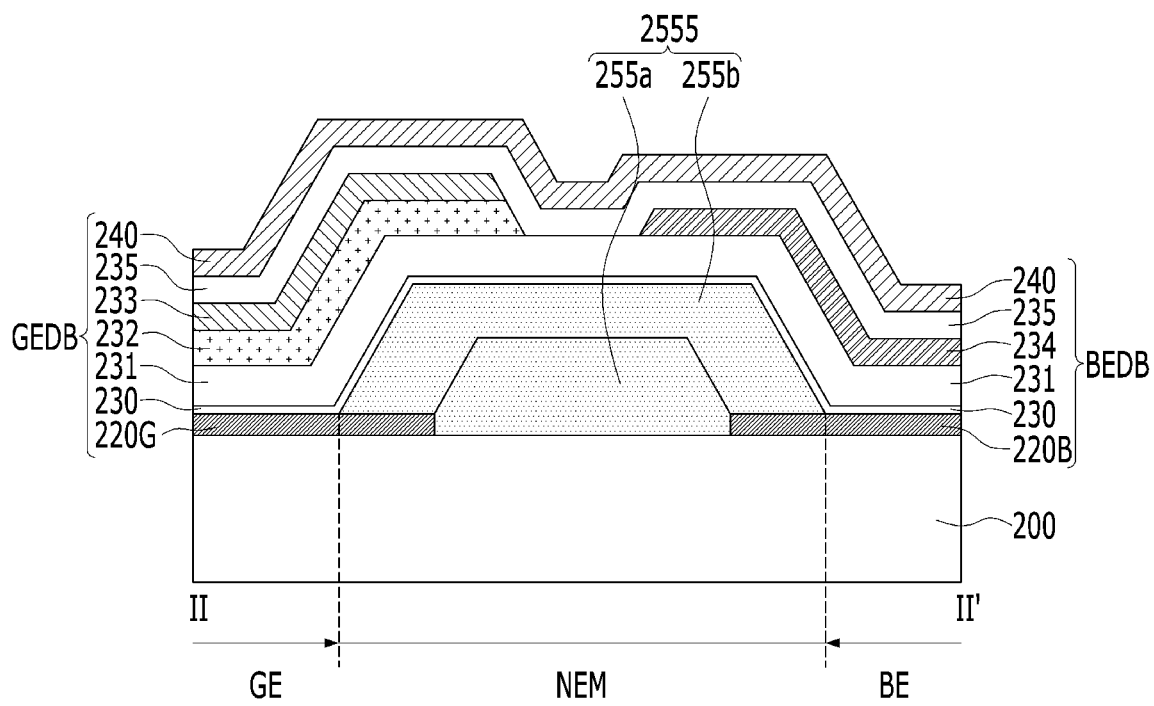
FIG. 6B is a cross-sectional view taken along II-II' of FIG. 6A.
Figure 7:
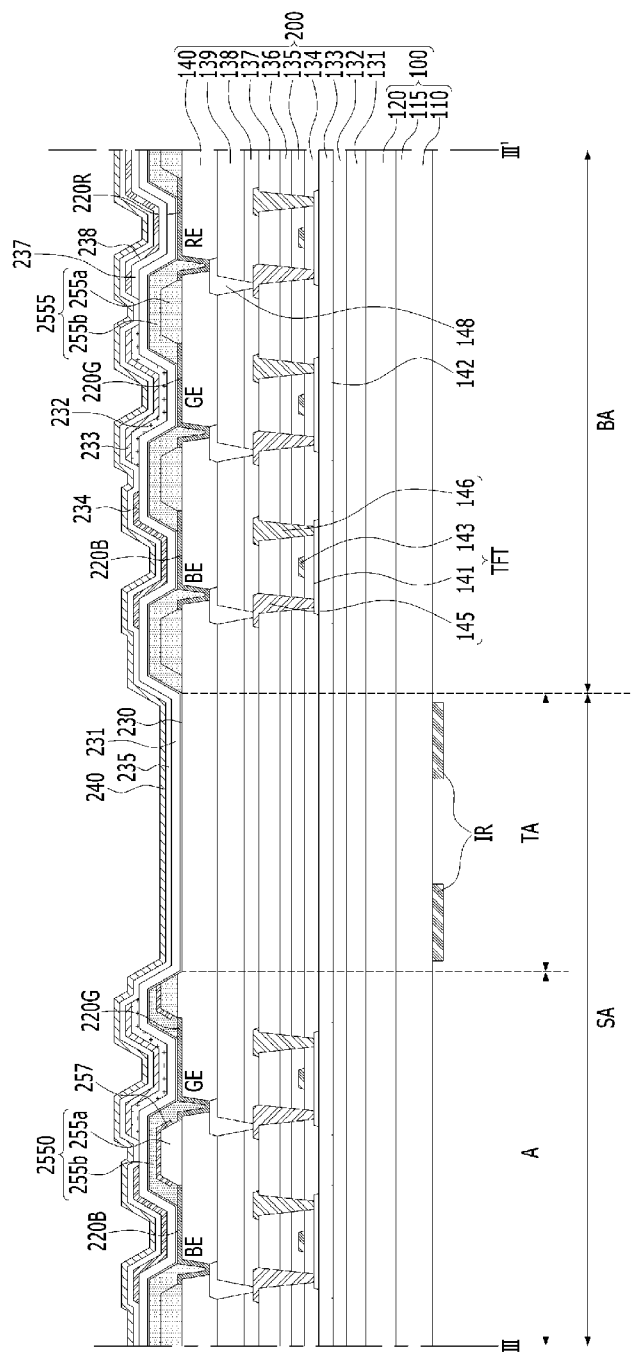
FIG. 7 is a cross-sectional view taken along III-III' of FIG. 4.

5B is a cross-sectional view taken along I-I' of FIG. 5A. In addition, FIG. 6A is an enlarged view of area B in FIG. 4, FIG. 6B is a cross-sectional view taken along II-II' of FIG. 6A. FIG. 7 is a cross-sectional view taken along III-III' of FIG. 4.

FIG. 4 illustrates a first area SA overlapping the sensor unit of the substrate, and a second area BA adjacent to the first area SA and not overlapping the sensor unit in the display device according to the second exemplary embodiment of the present disclosure.

As shown in FIGS. 4 to 7, the display device according to the second embodiment of the present disclosure includes a substrate 100 having an active area (See AA in FIG. 1) including a first area SA overlapping the sensor unit, and a second area BA not overlapping the sensor unit, and a non-active area NA surrounding the active area, banks 2550 and 2555 defining a first light-emitting portion BE, a second light-emitting portion GE, and a third light-emitting portion RE spaced apart from each other in the first area SA and the second area BA, and a reflective layer 257 spaced apart from each of the three light-emitting portions BE, GE, and RE, and surrounding the second light-emitting portion GE. For example, the first light-emitting portion BE may be a blue light-emitting portion, the second light-emitting portion GE may be a green light-emitting portion, and the third light-emitting portion RE may be a red light-emitting portion. The color arrangement of the first to third light-emitting portions BE, GE, and RE may vary depending on the environment or purpose for which the display device is used.

As shown in FIGS. 4 and 7, the arrangement density of the first to third light-emitting portions BE, GE, and RE in the first area SA may be smaller than that in the second area BA. For example, the first area SA may further include a transmissive portion TA compared to the second area BA and may include a sensor IR in the transmissive portion TA so that the light-emitting element does not overlap the sensor IR to improve the sensitivity of the sensor IR. However, the display device of the present disclosure is not limited to that shown in FIG. 7, and the sensor IR may also overlap the first to third light-emitting portions BE, GE, and RE in the first area SA.

The sensor IR may be an image sensor capable of acquiring a video image of an object under the substrate 100, may be an infrared sensor capable of radiating infrared rays to an object disposed under the substrate 100 or extracting infrared information from the object, or may be an ultraviolet sensor capable of radiating ultraviolet light to an object located below the substrate 100 or extracting ultraviolet information from an object or environment.

The sensor unit may be provided on a surface opposite to a surface of the substrate 100 on which the first to third light-emitting portions are formed.

The first area SA overlapping the sensor unit may be divided into a light-emitting unit A in which the light-emitting portions BE, GE, and RE are disposed, and a transmissive portion TA. Meanwhile, in the second area BA that does not overlap with the sensor unit, the light-emitting portions BE, GE, and RE are regularly arranged without the transmissive portion TA.

The first to third light-emitting portions BE, GE, and RE in the first area SA may be divided by the arrangement of the first bank 2550 and the reflective layer 257 may be provided to surround the second light-emitting portion GE and overlap the first bank 2550. Meanwhile, as shown in FIG. 4, the second area BA not including a sensor unit includes a second bank 2555 defining the first to third light-emitting portions BE, GE, and RE, and the second bank 2555 may not have a reflective layer.

The reflective layer 257 is provided to surround the second light-emitting portion GE emitting green light in the first area in the display device according to the second exemplary embodiment of the present disclosure because, compared to the first light-emitting portion BE emitting blue and the third light-emitting portion RE emitting red, the second light-emitting portion GE has delayed rising and falling operations and thus the light emitted from the second light-emitting portion GE greatly affects the operation of the sensor IR. Therefore, when the sensor IR is disposed below the second light-emitting portion GE or flatly adjacent to the second light-emitting portion GE, and the reflective layer 257 is not provided, the light emitted from the second light-emitting portion GE is transmitted to the sensor IR and thus may be affected by light-emission driving of the second light-emitting portion GE.

The light-emitting portions BE, GE, and RE emit light not only directly from the light-emitting layer but also radiate light in various directions therefrom. Although the sensor IR is not disposed directly below the second light-emitting portion GE and the sensor IR is disposed adjacent to the light-emitting portion GE, when the reflective layer 257 is not provided, the sensor IR may be affected by light directed downward from the second light-emitting portion GE.

As shown in FIGS. 4 to 7, the reflective layer 257 is selectively provided around the second light-emitting portion GE in consideration of the fact that the second light-emitting portion GE emitting green light has delayed falling and rising compared to the first and third light-emitting portions BE and RE emitting other colors.

When the delay of the light-emitting portion of a color different from green is great due to the difference in light-emitting characteristics or materials provided in light-emitting portions, the reflective layer 257 may be provided around the light-emitting portion of a color other than green.

Meanwhile, an example of the display device of FIG. 4 shows a state in which the first to third light-emitting portions BE, GE, and RE are each arranged in a first diagonal direction D1 and a second diagonal direction D2. However, the light-emitting portions of the display device of the present disclosure are not limited to this arrangement.

In the display device according to the second embodiment of the present disclosure, the arrangement of the light-emitting portions in each of the first area SA and the second area BA is as follows. That is, the first light-emitting portions BE and the second light-emitting portions GE are alternately disposed in the first line of the first diagonal direction D1, and the second light-emitting portion GE and the third light-emitting portion RE are alternately disposed in the second line adjacent to the first line in the first diagonal direction D1.

The second light-emitting portions GE of the first line and the second line adjacent to each other in the first diagonal direction D1 may form an elongated ellipse in the first diagonal direction D1 and the second diagonal direction D2 crossing each other. Like the second light-emitting portion GE of FIG. 4, the second light-emitting portion GE that occupies the highest ratio in representing the white may be arranged in a higher number than the first and third light-emitting portions BE and RE. When the second light-emitting portions GE are alternately arranged in an elongated shape in the first diagonal direction D1 and the second diagonal direction D2 in each column, color shift or luminance degradation according to change in viewing angle may be controlled.

In the display device of FIG. 4, a set of one first light-emitting portion BE and one third light-emitting portion RE provided in a virtual diamond shape and two second light-emitting portions GE adjacent to upper and lower parts of the first light-emitting portion BE and the third light-emitting portion RE are regularly arranged on the substrate 100.

Figure 5B:
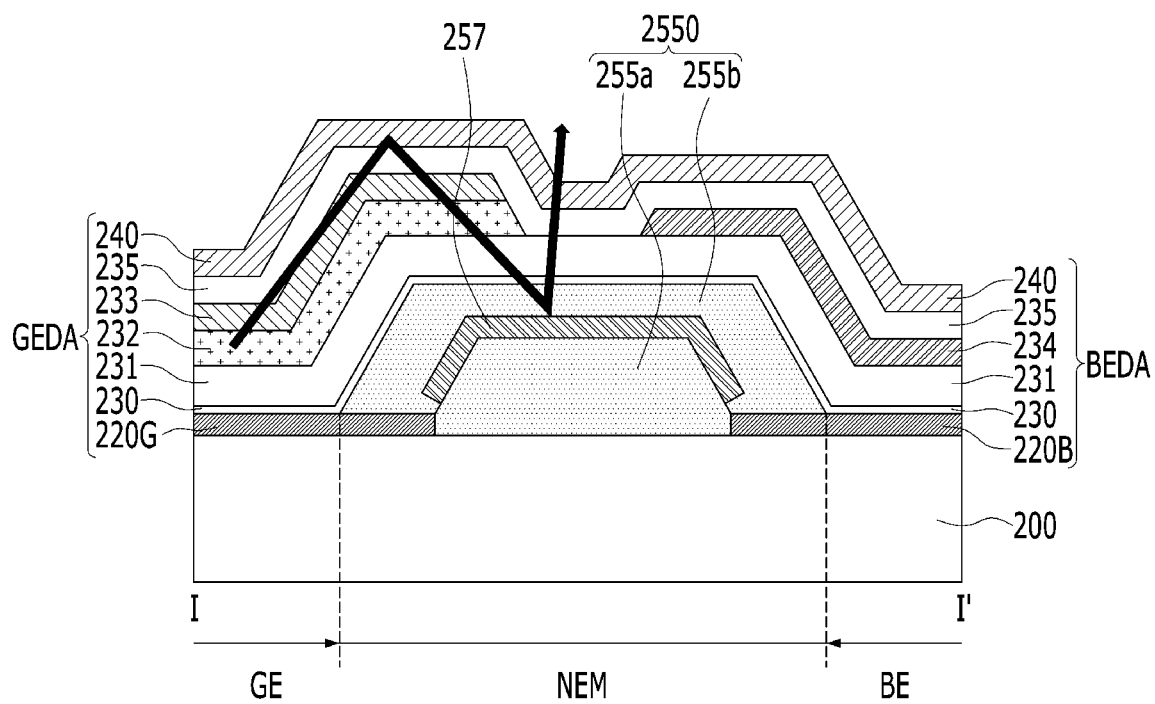
FIG. 5B is a cross-sectional view taken along I-I' of FIG. 5A.

The configuration of the light-emitting portions BE, GE, and RE included in the first area SA will be described with reference to FIGS. 5A and 5B.

Each of the light-emitting elements GEDA and BEDA provided in the light-emitting portions BE, GE, and RE of the first area SA includes an anode 220G or 220B, a hole injection layer 230, a hole transport layer 231, a light-emitting layer 233 or 234, an electron transport layer 235, and a cathode 240.

The first to third light-emitting portions BE, GE, and RE include a blue light-emitting layer 234, a green light-emitting layer 233, and a red light-emitting layer (see 238 in FIG. 7) as light-emitting layers, respectively, and the light-emitting layers may be formed separately in different regions using a deposition mask for each color. The blue light-emitting layer 234, the green light-emitting layer 233, and the red light-emitting layer may be formed in areas of the first to third light-emitting portions BE, GE, and RE, respectively, and parts of the peripheries thereof in consideration of process margins.

In addition, in the light-emitting elements GEDA and BEDA of the first to third light-emitting portions BE, GE, and RE, light emitted from the light-emitting layers 234, 233, and 238 between the anodes 220G and 220B, and the cathode 240 is emitted after resonance occurs based on repeated reflection and re-reflection between the anodes 220G and 220B and the cathode 240. The vertical position of the optimal light-emitting region for each light-emitting color may vary. In order to adjust the optimal light-emitting region, for example, an auxiliary hole transport layer 232 may be further provided in the second light-emitting portion GE. An auxiliary hole transport layer (see 237 in FIG. 7) may be further formed in the third light-emitting portion RE that emits red light. In each light-emitting portion, the auxiliary hole transport layers 232 and 237 may be formed with different thicknesses and/or different materials.

In the display device according to the second embodiment of the present disclosure, the reflective layer 257 is provided around the second light-emitting portion GE provided in the first area SA. For this purpose, the first bank 2550 is used. The first bank 2550 may include a first layer 255a and a second layer 255b, and the reflective layer 257 may be disposed between the first layer 255a and the second layer 255b.

The reflective layer 257 reflects light, which is emitted from the green light-emitting layer 233 to the outside of the second light-emitting portion GE, upward. In order to effectively perform this reflection, the reflective layer 257 is provided in the first bank 2550 vertically and horizontally adjacent to the radiation area of light.

In the first bank 2550, the first layer 255a is disposed between the anodes 220B and 220G adjacent to each other and the reflective layer 257 is provided on the top and side surfaces of the first layer 255a. Here, both edges of the first layer 255a may contact edges of adjacent anodes 220B and 220G. In addition, when the reflective layer 257 is made of a metal, the reflective layer 257 on the side of the first layer 255a may extend to a part of the side thereof such that it is spaced apart from the anodes 220B and 220G. The second layer 255b has a thickness greater than that of the reflective layer 257 to cover the reflective layer 257. Exposed portions of the second layer 255b of the first bank 2550 define light-emitting portions BE, GE, and RE.

When the transmissive portion TA is provided in the first area SA, the first bank 2550 may be omitted from the first area SA for transparency of the transmissive portion TA. In addition to the bank 2550, the configuration of the light-emitting element and the configuration of the thin film transistor in the transmissive portion TA are omitted. The transmissive portion TA is formed along with common layers commonly provided in the active area when forming the light-emitting device, that is, a hole injection layer 230, a hole transport layer 231, an electron transport layer 235, and a cathode 240. This serves to form the common layers integrally without forming a separate opening in the active area when forming the common layers. When forming the light-emitting element, the common layers are very thin and transparent and thus have no effect on the transparency of the transmissive portion TA. The sensor IR may partially overlap the transmissive portion TA and the light-emitting portion in the first area SA.

In some cases, a part of the substrate 100 and/or a part of a plurality of insulating layers on the substrate 100 may be removed from the transmissive portion TA.

The reflective layer 257 is spaced apart from the first to third light-emitting portions BE, GE, and RE, so as not to hinder the emission efficiency of light emitted from each light-emitting portion.

In addition, the reflective layer 257 is disposed between the anode 220G of the second light-emitting portion GE and the anodes 220B of the first and third light-emitting portions BE and RE adjacent thereto, and surrounds the periphery of the second light-emitting portion GE. Even if light emitted from the green light-emitting layer 233 is delayed, the delayed and emitted light is directed upward, which is the direction of light emission and has no effect on the sensor IR located on the lower side of the substrate 100. Accordingly, the display device according to the second embodiment of the present disclosure can improve driving reliability of the first area including the sensor unit.

Meanwhile, in the second area BA, the first to third light-emitting portions BE, GE, and RE are defined by a second bank 2555 as shown in FIGS. 6A and 6B. The second bank 2555 includes a first layer 255a disposed between the anodes 220B, 220G, and 220R of the first to third light-emitting portions BE, GE, and RE, and a second layer 255b covering the first layer 255a.

In the display device shown in FIG. 4, the first light-emitting portion BE and the third light-emitting portion RE have a different size and shape from the second light-emitting portion GE. Since required luminance efficiency varies depending on the color emitted by each light-emitting portion, the size may be changed. If necessary, the first to third light-emitting portions BE, GE, and RE may have the same size or different sizes. Different sizes may be applied to the first area and the second area.

FIG. 7 shows an example in which the first and second banks 2550 and 2555 are formed in the same process, and the first area SA and the second area BA differ in the presence or absence of the reflective layer 257 in the first and second banks 2550 and 2555. In addition, the first bank 2550 is formed with continuity between the first to third light-emitting portions BE, GE, and RE of the first area SA, and the second bank 2555 is formed with continuity between the first to third light-emitting portions BE, GE, and RE of the second area BA. When the first bank 2550 and the second bank 2555 are observed on a plane, the second layer 255b has a lattice shape having openings the size of each light-emitting portion, and the first layer 255a has a lattice with a smaller width than the second layer 255b and has a larger opening than the second layer 255b.

The configuration of an array substrate 200 including the substrate 100 and an array provided on the substrate 200 will be described with reference to FIG. 7.

The substrate 100 may include a glass substrate or a plastic substrate.

In addition, as shown in FIG. 7, the substrate 100 may be formed in a multilayer structure to improve vulnerability of the plastic substrate to moisture in external air and to protect the internal array. For example, the substrate 100 may include first and second plastic films 110 and 120, and an inorganic interlayer insulating film 115 between the first and second plastic films 110 and 120. The first and second plastic films 110 and 120 may be polyimide, polyethylene terephthalate (PET), polyethylene naphthalate (PEN), or polycarbonate (PC). In addition, the inorganic interlayer insulating film 115 may be an oxide layer, a nitride layer, or an oxynitride layer.

When the substrate 100 includes a substrate formed of a plastic component, the light-emitting display device 1000 may be implemented as a flexible display device that is bendable or flexible.

A thin film transistor substrate 200 includes a plurality of buffer layers 131 and 132, a thin film transistor TFT, and a connection electrode 148 connected to the thin film transistor TFT and each light-emitting element of the first to third light-emitting portions BE, GE, and RE, and interlayer insulating films 133, 134, 135, 136, 137, 138, 139, and 140.

The thin film transistor TFT includes an active layer 141, a source electrode 145 and a drain electrode 146 in contact with both sides of the active layer 141, and a gate electrode 143 overlapping the channel of the active layer 141. The thin film transistor TFT shown in FIG. 7 may be electrically connected to a light-emitting element in a sub-pixel and may function as a driving thin film transistor. A light-blocking layer 142 is further provided below the active layer 141 to block light generated from the lower side of the substrate 100.

An active buffer layer 133 may be provided between the light blocking layer 142 and the active layer 141. A gate insulating layer 134 may be provided between the active layer 141 and the gate electrode 143.

First to third interlayer insulating films 135, 136, and 137 may be provided between the gate electrode 143, the source electrode 145, and the drain electrode 146. The first to third interlayer insulating films 135, 136, and 137 may be integrated into one layer. As shown in the drawing, when a plurality of layers of the first to third interlayer insulating films 135, 136, and 137 is provided, an electrode layer for an electrode of a storage capacitor is further provided, along with the gate electrode 143, the source electrode 145, and the drain electrode 146, on at least one of the first interlayer insulating film 135 or the second interlayer insulating film 136, or an electrode of other transistors that are directly connected to the anodes 220B, 220G, and 220R, in addition to the transistor TFT of FIG. 5, may be further formed.

The plurality of buffer layers 131 and 132, the active buffer layer 133, the gate insulating film 134, and the first to third interlayer insulating films 135, 136, 137, 138, and 139 may be a silicon nitride film, a silicon oxide film, or a silicon oxynitride film. In some cases, these layers may contain a metal or inorganic component other than silicon, nitrogen, and oxygen, while maintaining insulating properties.

The fourth and fifth interlayer insulating films 138 and 139 are provided on the source electrode 145 and drain electrode 146 and the third interlayer insulating film 137 of the thin film transistor TFT and the connection electrode 148 is connected to the source electrode 145 or the drain electrode 146 through a contact hole that exposes the source electrode 145 or the drain electrode 146 through the fourth and fifth interlayer insulating films 138 and 139. The fourth interlayer insulating film 138 may be formed of an inorganic insulating film such as an oxide film, a nitride film, or an oxynitride film, and the fifth interlayer insulating film 139 may be formed of an organic insulating film such as photoacryl or BCB. In some cases, the fourth and fifth interlayer insulating films 138 and 139 may be integrated into one layer.

In addition, a planarization layer 140 is provided above the connection electrode 148 and the fifth interlayer insulating film 139 to planarize the surface, and the connection electrode 148 may be connected to the anodes 220B, 220G, and 220R provided to the respective light-emitting portions BE, GE, and RE through a contact hole penetrating the planarization layer 140. The planarization layer 140 may be formed of an organic insulating film such as photoacryl or BCB.

In addition, any one of buffer layers 131 and 132, the active buffer layer 133, the gate insulating film 134, and the first to fifth interlayer insulating films 135, 136, 137, 138, and 139 may include an organic insulating film or an additional organic insulation film may be further provided to secure flexibility and surface uniformity of the display device.

The light-emitting elements of the first to third light-emitting portions may be formed on the thin film transistor substrate 200.

Meanwhile, in order to further improve transmittance in the transmissive portion TA overlapping the sensor IR in the first area SA, a plurality of buffer layers 131 and 132, the active buffer layer 133, the gate insulating layer 134, and the first to fifth interlayer insulating layers 135, 136, 137, 138, and 139 may be removed from the second plastic film 120 of the substrate 100. In this case, the transmissive portion TA may have a surface lower than that of the second area BA and the area A where the light-emitting portions of the first area are disposed.

Meanwhile, in the display device of the present disclosure, the reflective layer 257 has a closed loop shape surrounding the entire periphery of the second light-emitting portion GE so as to prevent light from the second light-emitting portion GE from being directed downward, but is not limited thereto. The reflective layer 257 may have a partial opening in the area surrounding the outer circumference of the second light-emitting portion GE, as long as it does not affect driving of the sensor on the lower side of the thin film transistor substrate 200.

The reflective layer 257 may be formed to be large enough to correspond to the entire upper surface and side of the first layer 255a provided in the first area SA such that it comes into contact with the outer circumference of the first light-emitting portion BE or the third light-emitting portion RE adjacent to the outside of the second light-emitting portion GE, but is not limited thereto. The reflective layer 257 may be provided only in a region corresponding to the partial width between the outer circumference of the second light-emitting portion GE and the outer circumference of the first light-emitting portion BE or the third light-emitting portion RE. Forming the reflective layer 257 close to the outer circumference of the second light-emitting portion GE can effectively prevent light emitted from the second light-emitting portion GE from being transferred to the lower side.

Figure 8:
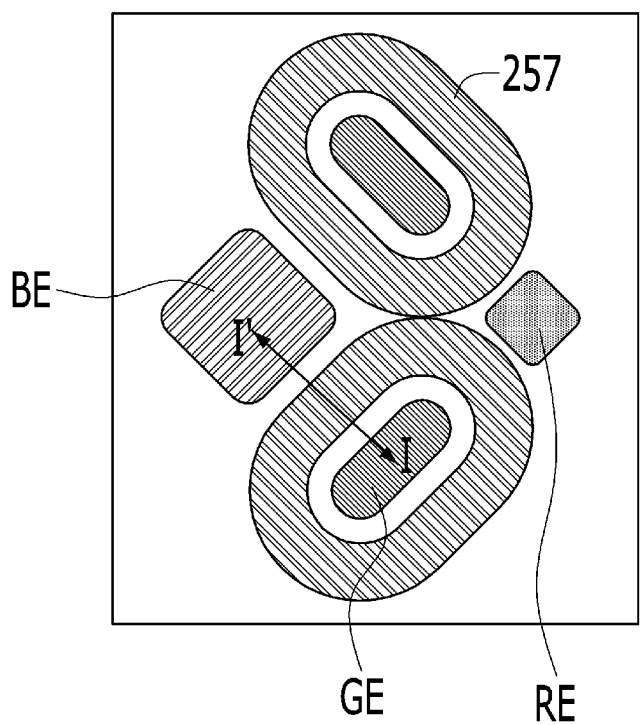
FIG. 8 is an enlarged view of area A in IG. 4 according to another embodiment.

FIG. 8 is an enlarged view illustrating another embodiment of area A of FIG. 4.

As shown in FIG. 8, the reflective layer 257 surrounding one second light-emitting portion GE may come into contact with the reflective layer 257 surrounding another adjacent second light-emitting portion GE. Even in this case, the reflective layer 257 maintains the distance from the first to third light-emitting portions BE, GE, and RE, and does not invade the light-emitting area of each light-emitting portion.

As shown in FIG. 8, the reflective layers 257 in contact with each other may be disposed between the second light-emitting portions GE emitting the same color, or between the second light-emitting portion GE and the other first or third light-emitting portion (BE or RE).

Since the bank 2550 is provided between the light-emitting portions spaced apart from each other in the first area SA, and the bank 2550 has continuity between the spaced light-emitting portions, the reflective layer 257 formed in the bank 2550 may also have continuity.

An encapsulation substrate may be further provided above the cathode 240 of the display device. The encapsulation substrate may be a plastic film or a glass substrate, and a filler may be further included between the cathode 240 and the encapsulation substrate. Alternatively, the encapsulation substrate may be provided with a thin film encapsulation structure in which one or more pairs of inorganic and organic layers are alternated.

Meanwhile, in the display device of the present disclosure, formation of the first bank 2550 including the reflective layer 257 according to an embodiment will be described.

FIGS. 9A to 9D are cross-sectional views illustrating a process of manufacturing the display device of the present disclosure in a first area.

Figure 9A:
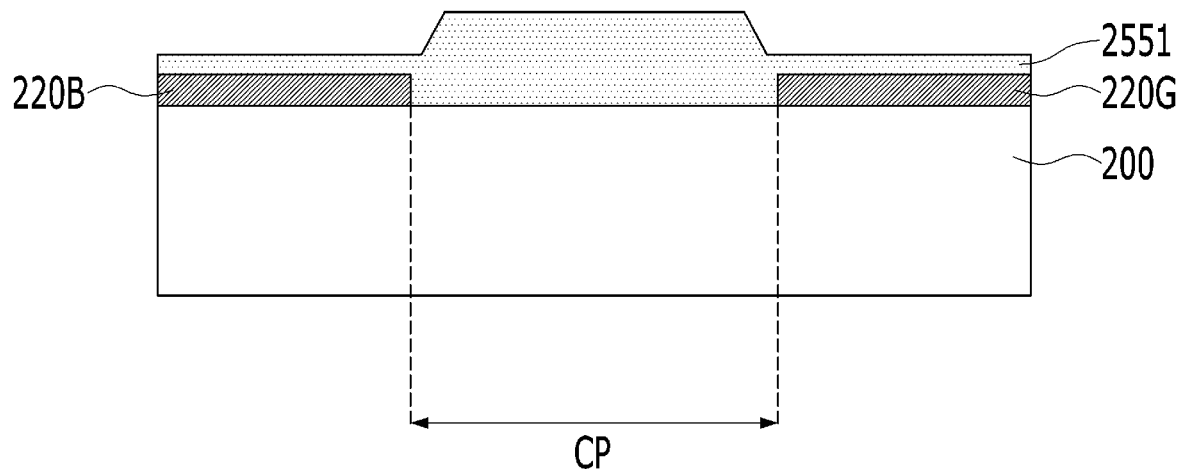
FIGS. 9A to 9D are cross-sectional views illustrating a process of manufacturing a display device of the present disclosure shown in a first area.

As shown in FIG. 9A, anodes 220B and 220G spaced apart from each other are formed on a thin film transistor substrate 200.

Then, an organic material is applied to the entire surface of the thin film transistor substrate 200 including the anodes 220B and 220G. At this time, a first material layer 2551 is formed to be higher than the surface of the planarization film (140 in FIG. 7) of the exposed thin film transistor substrate 200 not including the anodes 220B and 220G, compared to the top surface of the anodes 220B and 220G, using the difference in properties between the surface of the planarization film (140 in FIG. 7) of the exposed thin film transistor substrate 200 not including the anodes 220B and 220G and the surface of the anodes 220B and 220G. The thickness of the first material layer 2551 may correspond to the thickness of the first layer 255a of the bank to be formed. In some cases, the first material layer 2551 may be selectively formed at a great height in the region CP of the thin film transistor substrate 200 not having the anodes 220B and 220G using a mask.

Figure 9B:
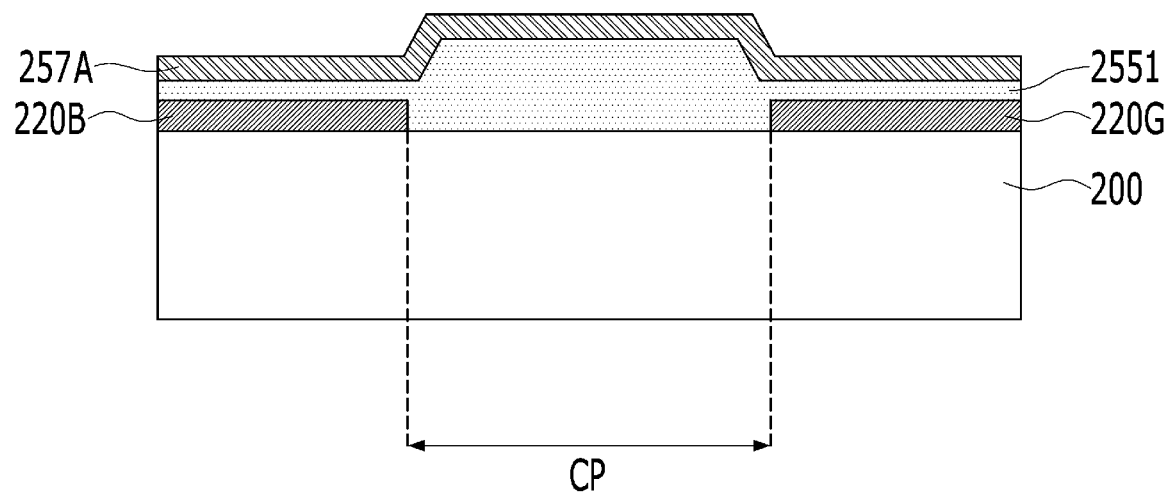

Subsequently, as shown in FIG. 9B, a reflective material layer 257A formed of a reflective metal or a reflective resin is formed on the first material layer 2551.

Figure 9C:
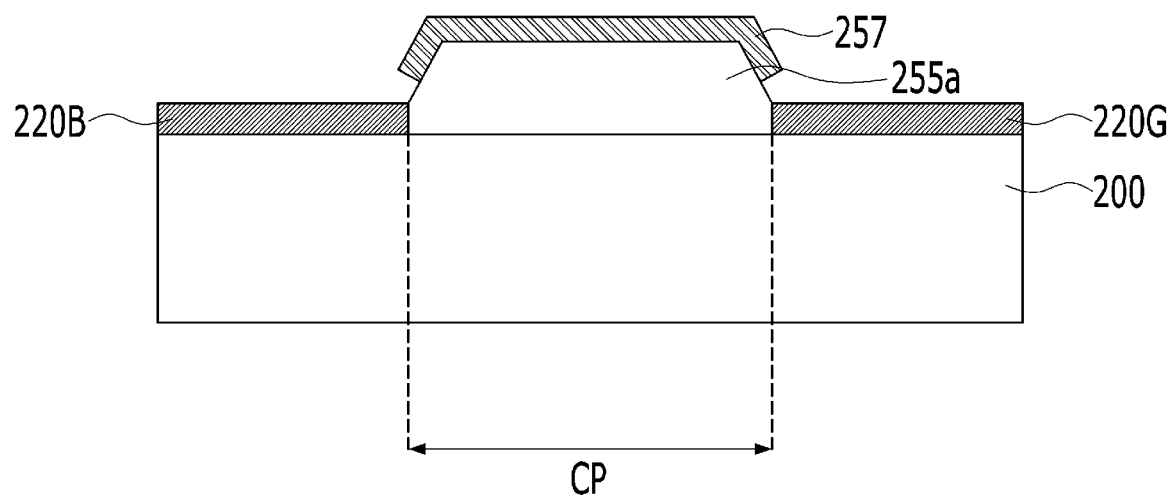

Subsequently, as shown in FIG. 9C, the reflective material layer 257A is left only in the region CP of the thin film transistor substrate 200 not including the anodes 220B and 220G by a lift-off method to form a reflective layer 257 and the first material layer 255a of the first bank is left therebelow. In this process, the reflective material layer 257A and the first material layer 2551 are also removed from the anodes 220B and 220G by a lift-off method. In addition, since the reflective material layer 257A is lifted upward and removed together with the first material layer 2551 by the lift-off method, the edge of the reflective layer 257 left close to the anodes 220B and 220G in the area "CP" is spaced at an angle apart from the surfaces of the anodes 220B and 220G.

Figure 9D:
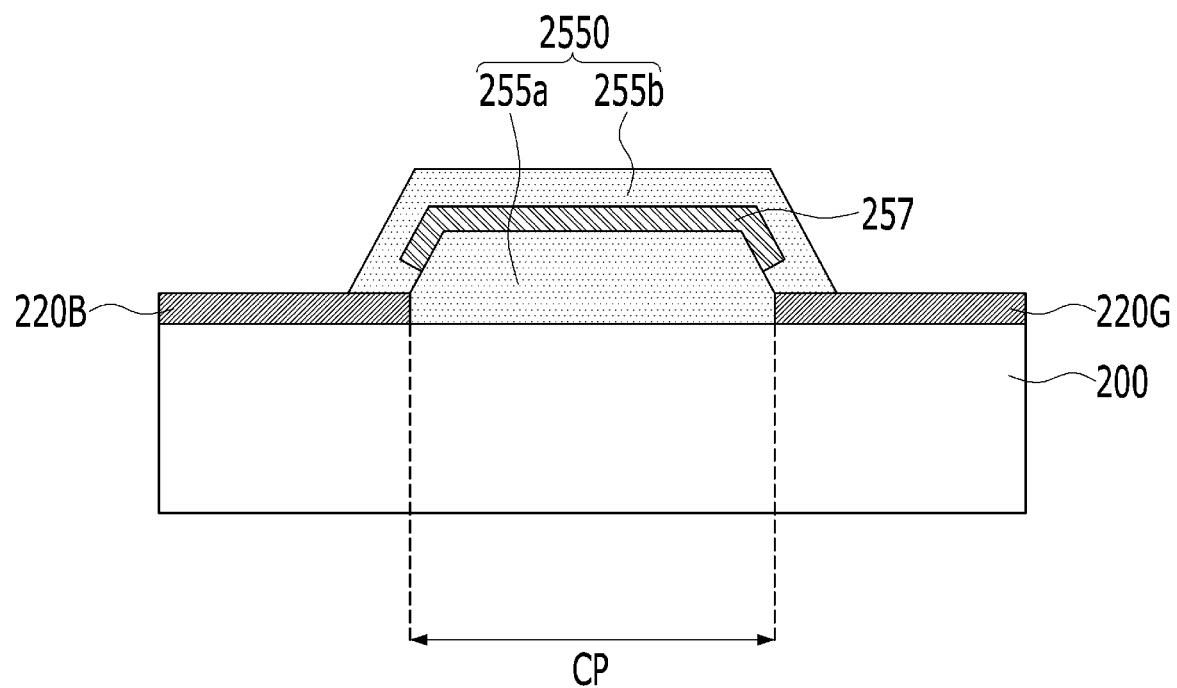

Subsequently, as shown in FIG. 9D, a second layer 255b is formed to cover the top of the first layer 255a, on which the reflective layer 257 is formed, and to cover the edges of the anodes 220B and 220G, thereby forming a double-layered bank 2550 including the first layer 255a and the second layer 255b.

Hereinafter, the reason why the reflective layer is provided around the second light-emitting portion emitting green light in the display device according to the second embodiment of the present disclosure will be described.

The results of experiments in a structure in which a reflective layer is not provided in a bank shown in FIGS. 6A and 6B will be described.

Figure 10:
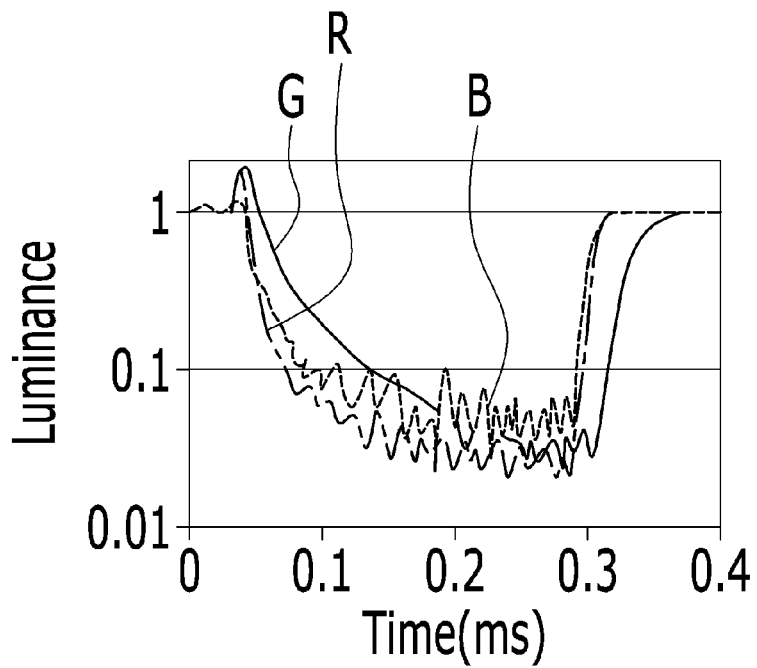
FIG. 10 is a graph showing luminance over time of a red light-emitting portion, a green light-emitting portion, and a blue light-emitting portion.
Figure 11:
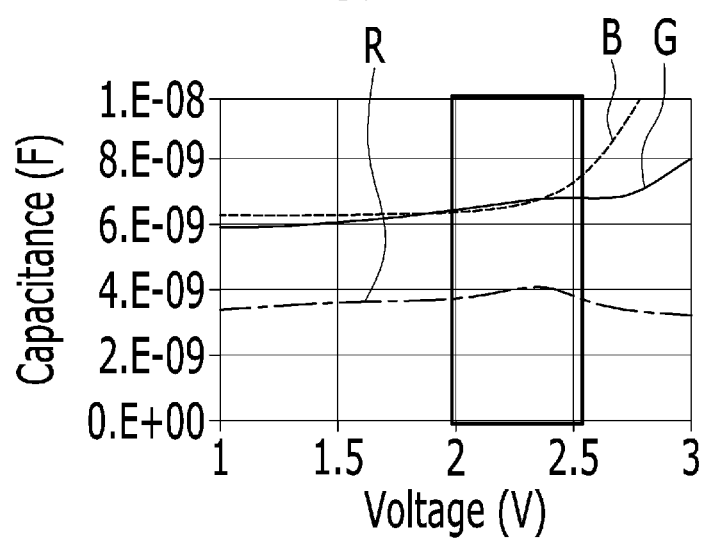
FIG. 11 is a graph showing capacitance as a function of driving voltage of a red light-emitting portion, a green light-emitting portion, and a blue light-emitting portion.
Figure 12:
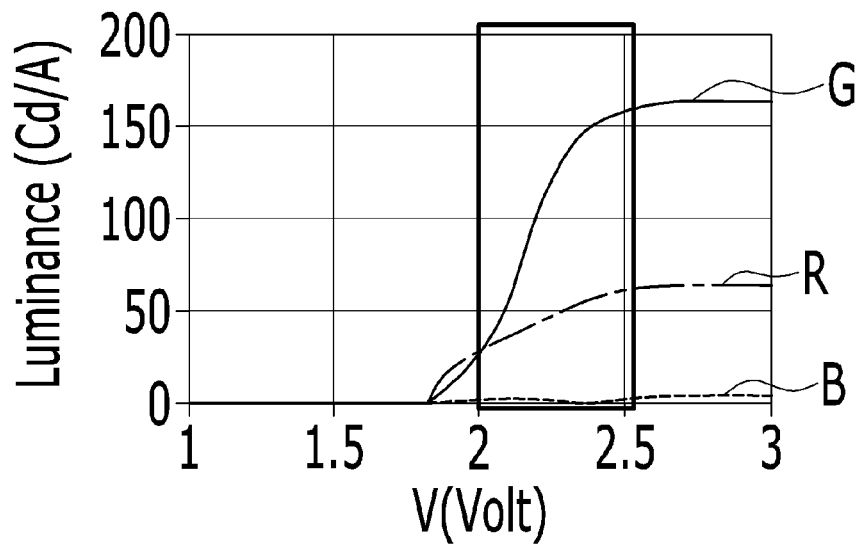
FIG. 12 is a graph showing luminance as a function of driving voltage of a red light-emitting portion, a green light-emitting portion, and a blue light-emitting portion.

FIG. 10 is a graph showing luminance over time of a red light-emitting portion, a green light-emitting portion, and a blue light-emitting portion, FIG. 11 is a graph showing capacitance as a function of driving voltage of a red light-emitting portion, a green light-emitting portion, and a blue light-emitting portion, and FIG. 12 is a graph showing luminance as a function of driving voltage of a red light-emitting portion, a green light-emitting portion, and a blue light-emitting portion.

TABLE 1

|  | Light-emitting portion | | |
| --- | --- | --- | --- |
|  | R | G | B |
| Rising time (µs) | 18 | 45 | 21 |
| Falling time (µs) | 27 | 77 | 40 |

As shown in FIG. 10, when the light-emitting elements of the red light-emitting portion R, the green light-emitting portion G, and the blue light-emitting portion B respectively reduce the luminance from 1 to 0.1, the falling time at 0 ms to 0.2 ms occurs in the order of the red, blue and green light-emitting portions. As can be seen from Table 1, the falling time of the red light-emitting portion was 27 µs, the falling time of the blue light-emitting portion was 40 µs, and the falling time of the green light-emitting portion was 77 µs. This indicates that the falling time of the green light-emitting portion was about three times that of the red light-emitting portion.

In addition, as can be seen from FIG. 10, the red light-emitting portion and the blue light-emitting portion have similar rising times at the luminance from 0.1 to 1 at around 0.3 ms, and the green light-emitting portion has a rising time twice or more of that of the red and blue light-emitting portions. As can be seen from Table 1, the red light-emitting portion, the blue light-emitting portion, and the green light-emitting portion had rising times of 18 µs, 45 µs, and 21 µs in this order.

That is, as can be seen from FIG. 10 and Table 1, the green light-emitting portion had delayed falling and rising operations. On the other hand, as can be seen from the above experimental results, greatly delayed falling and rising may be referred to as "great transient variation of EL in the light-emitting portion". Such transient variation may vary depending on material characteristics of the light-emitting layer or required light-emitting intensity. Accordingly, a display device requiring use of different materials and different light-emitting intensities may include a reflective layer in a light-emitting portion of a color other than the green light-emitting portion.

When comparing capacitance as a function of a driving voltage between the red light-emitting portion, the green light-emitting portion, and the blue light-emitting portion with reference to FIG. 11, the blue light-emitting portion B and the green light-emitting portion G exhibited high capacitance at a driving voltage of 2V to 2.5V and the red light-emitting portion R exhibited a low capacitance.

In addition, as can be seen from FIG. 12, when comparing luminance as a function of driving voltage between the red light-emitting portion, the green light-emitting portion, and the blue light-emitting portion, the luminance of the green light-emitting portion G, the red light-emitting portion R, and the blue light-emitting portion B are obtained at a driving voltage of 2V to 2.5V. FIG. 12 shows that it is difficult to drive the blue light-emitting portion B at a driving voltage for driving the green light-emitting portion G and therefore, the driving voltage required to drive the blue light-emitting portion B is great.

Considering both capacitance and luminance as a function of a driving voltage of FIGS. 11 and 12, the blue light-emitting portion has a high capacitance, but low luminance, at the same driving voltage and thus has a small effect on radiated light, whereas the red light-emitting portion has low capacitance and low luminance at the same driving voltage, and thus has a small effect on radiated light.

On the other hand, the green light-emitting portion exhibits high capacitance and high luminance at the same driving voltage, and also has a greatly delayed rising and falling when the light-emitting element is turned on/off, and light is generated by remaining charge when the light-emitting element is driven at a high frequency and as a result, operation failure of the sensor unit may be caused by unintended light.

In order to prevent this problem, the display device according to the second embodiment of the present disclosure includes a reflective layer around the green light-emitting portion having greatly delay operations, guides the light emitted from the green light-emitting portion back to the light-emitting direction, prevents the effect of the light of the green light-emitting portion on the sensor on the lower side of the substrate, and improves reliability of operation of the sensor.

Hereinafter, the material properties of the reflective layer will be described.

Figure 13:
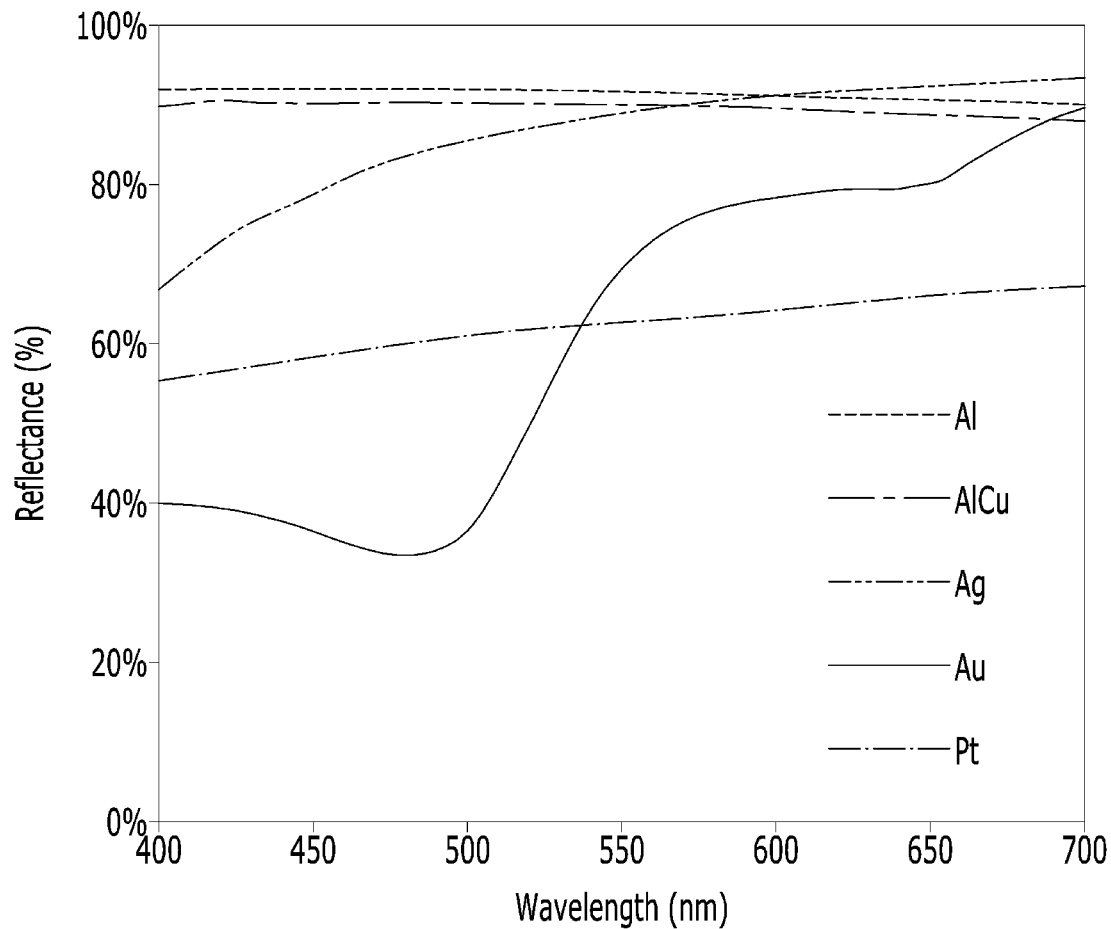
FIG. 13 is a graph showing reflectance as a function of wavelength depending on each component of the reflective layer.

FIG. 13 is a graph showing reflectance as a function of wavelength depending on each component of the reflective layer.

As shown in FIG. 13, the components of the reflective layer were changed to aluminum (Al), aluminum copper alloy (AlCu), silver (Ag), gold (Au), and platinum (Pt), and reflection characteristics thereof were examined according to wavelength. The thickness of each component was set to 400 Å.

In particular, aluminum (Al), aluminum copper alloy (AlCu), and silver (Ag) exhibit reflectance of 90% or more in a green wavelength range of 530 nm or more. In addition, gold (Au) and platinum (Pt) also exhibit a reflectance of 50% or more in a long wavelength band equal to or greater than the green wavelength region. That is, a significant reflection effect was observed in a reflective metal tested in FIG. 13.

On the other hand, emitted light directed downward from the green light-emitting portion has lower luminance than direct light, and even if it has a reflectance of 50% or more, it can control abnormal operation of the sensor.

In addition, the reflective layer may be laminated or alloyed with different reflective metals or increased in thickness to further improve the reflection effect in a longer wavelength range than the green wavelength range.

Figure 14:
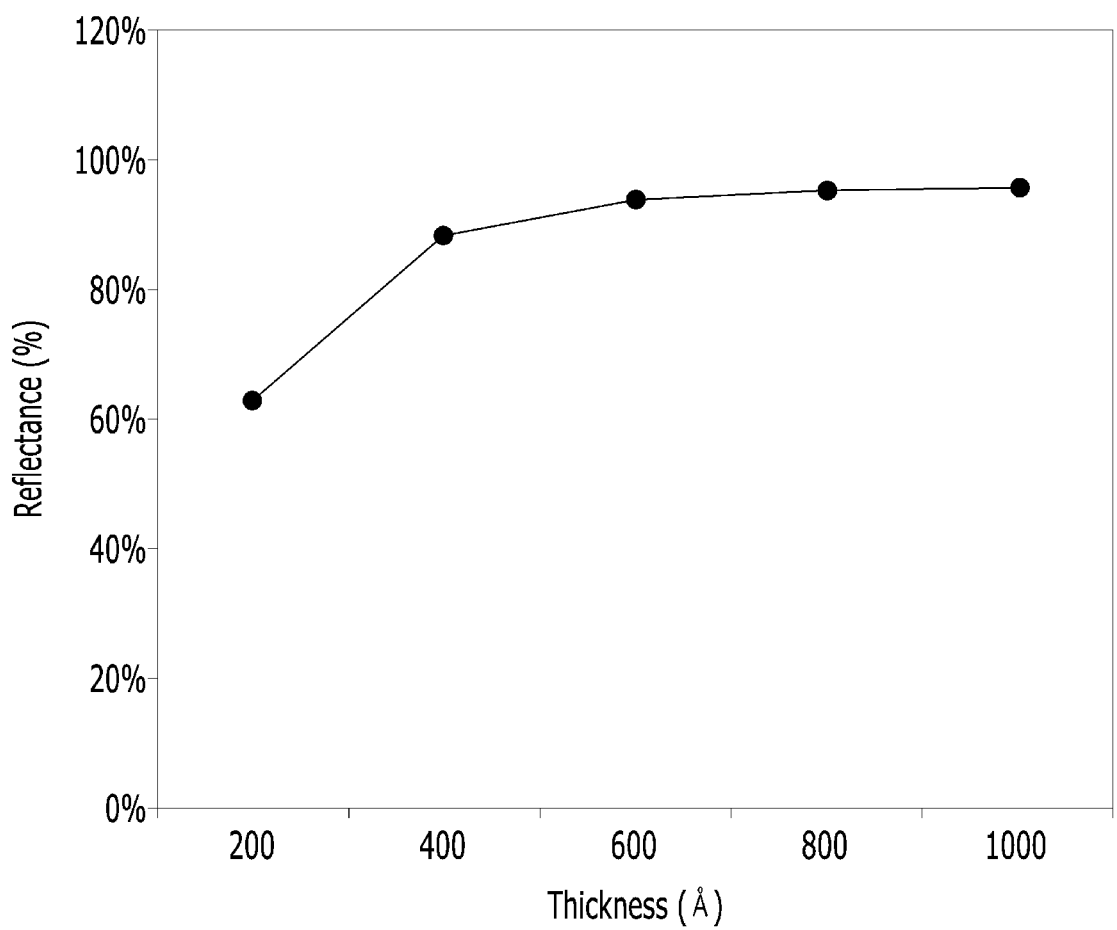
FIG. 14 is a graph showing reflectance as a function of the thickness of the reflective layer.

FIG. 14 is a graph showing the reflectance depending on the thickness of the reflective layer.

FIG. 14 shows reflectance when the thickness of silver (Ag) used as a material of the reflective layer changes.

As shown in FIG. 14, a reflectance of 90% or more was obtained when the thickness of the reflective layer was set to 400 Å or more.

The thickness of the reflective layer is equivalent to the total thickness of one to three layers of the light-emitting layer or the common layer included in the light-emitting element and does not significantly change the morphology of the side surface of the bank. In addition, even if the thickness of the second layer covering the reflective layer in the bank is reduced to the level of the reflective layer, the side surface of the bank can be uniform.

In the display device according to the second exemplary embodiment of the present disclosure, the reflective layer may be provided only around the green light-emitting portion, as shown in FIGS. 4 to 7.

That is, the reflective layer returns the light travelling downward from the light-emitting portion upward to prevent the light from travelling downward and thereby to prevent abnormal operation of the sensor under the substrate or the element structure located below the light-emitting element. In particular, when a reflective layer is provided around a green light-emitting portion having greatly delayed falling and rising, driving of a sensor by green light emitted from the light-emitting element can be prevented and product reliability can be more effectively improved.

However, the display device of the present disclosure is not limited to this and may be applied to any configuration that is intended to prevent light emitted from the light-emitting portion from being transmitted to the lower side and abnormal operation in the circuit configuration formed on the substrate or the operation of the sensor under the substrate. In addition to the green light-emitting portion, different color light-emitting portion having delayed rising and falling characteristics may be used based on material changes.

The display device of the present disclosure may prevent the light from travelling to a lower sensor and circuit by providing a reflective layer in the non-light-emitting portion, when light emitted from one light-emitting portion of a sub-pixel is directed toward the non-light-emitting portion. Therefore, the display device of the present disclosure may prevent the sensor and the circuit from being driven by the emitted light travelling in a direction opposite to the light-emitting direction, and improve sensing sensitivity by preventing abnormal driving of the sensor.

Also, the display device of the present disclosure may prevent the effect of side leakage current by providing a reflective layer around the light-emitting portion of a sub-pixel that has delayed rising and falling characteristics compared to other colors, generates a large capacitance at the same voltage during driving, and has a large influence on luminance.

The display device according to an exemplary embodiment of the present disclosure may include a substrate having a first light-emitting portion and a second light-emitting portion spaced apart from each other, a reflective layer spaced apart from each of the first and second light-emitting portions and surrounding the second light-emitting portion, a first light-emitting element including a first light-emitting layer in the first light-emitting portion, and a second light-emitting element including a second light-emitting layer in the second light-emitting portion. The second light-emitting layer emitting light may have a wavelength different from light emitted from the first light-emitting layer.

A sensor may be included on a surface opposite to a surface of the substrate on which the first light-emitting portion and the second light-emitting portion are provided.

The reflective layer may overlap the sensor.

The sensor may be at least one of an image sensor, an infrared sensor, or an ultraviolet sensor.

The reflective layer may be disposed in a bank provided between the first and second light-emitting portions.

The bank may include a first layer disposed between an anode of the first light-emitting element and an anode of the second light-emitting element, and a second layer provided on the first layer and covering the edges of the anode of the first light-emitting element and the anode of the second light-emitting element. The reflective layer may be provided between the first layer and the second layer.

An edge of the reflective layer may be spaced apart from each of the anode of the first light-emitting element and the anode of the second light-emitting element.

The second light-emitting portion may have an emission peak at a wavelength of 500 nm to 600 nm, and the first light-emitting portion may have an emission peak at a shorter wavelength or a longer wavelength than an emission peak of the second light-emitting portion.

A thickness of the reflective layer may be smaller than a thickness of each of the first layer and the second layer.

A cathode of the first light-emitting element may be integrated with a cathode of the second light-emitting element, and the anode of the first light-emitting element may be spaced apart from the anode of and the second light-emitting element. Each of the first light-emitting element and second light-emitting element may further comprise at least one common layer between the anode and the first or second light-emitting layer, and between the first or second light-emitting layer and the cathode.

In addition, a display device according to another embodiment of the present disclosure may include a substrate having an active area and a non-active area surrounding the active area, the active area including a first area overlapping a sensor unit and a second area not overlapping the sensor unit, a bank defining a first light-emitting portion, a second light-emitting portion, and a third light-emitting portion in each of the first area and the second area, and a reflective layer in the bank in the first area and spaced apart from the first to the third light-emitting portions, and surrounding the second light-emitting portion. The first light-emitting portion, the second light-emitting portion and the third light-emitting portion may be spaced apart from each other.

An arrangement density of the first to third light emitting portions in the first area may be smaller than an arrangement density of the first to third light-emitting portions in the second area.

The first area may further include a transmissive portion.

The second light-emitting portion may emit green light.

The sensor unit may comprise at least one of an image sensor, an infrared sensor, or an ultraviolet sensor, and is provided on a surface opposite to a surface of the substrate on which the first to third light-emitting portions are formed.

The bank may comprise a first layer contacting an outer circumference of an anode of the second light-emitting portion and disposed outside the second light-emitting portion, and a second layer covering an edge of the anode of the second light-emitting portion and provided on the first layer. The reflective layer may be provided between the first layer and the second layer.

The reflective layer may comprise a reflective metal or a reflective insulating layer.

One of the first and third light-emitting portions may emit red light and the other may emit blue light.

The transmissive portion may not overlap the bank.

The first to third light-emitting portions in each of the first area and the second area may comprise a first anode, a second anode, and a third anode spaced apart from each other and having an overlapping edge below the bank, a first light-emitting layer, a second light-emitting layer, and a third light-emitting layer provided on the first anode, the second anode and the third anode, respectively, and a cathode integrally provided on the first to third light-emitting layer. The second light-emitting layer of the first area may extend to a part of a top surface of the bank outside from the second light-emitting portion and may have an edge overlapping the reflective layer.

The display device of the present disclosure has the following effects.

First, a reflective layer is provided in the non-light-emitting portion, so that when light emitted from one light-emitting portion of a sub-pixel is directed toward the non-light-emitting portion, it is possible to prevent the light from travelling to a lower sensor and circuit. Therefore, it is possible to prevent the sensor and the circuit from being driven by the emitted light travelling in a direction opposite to the light-emitting direction, and to prevent abnormal driving of the sensor and thus improve sensing sensitivity.

Second, a reflective layer is provided around the light-emitting portion of a sub-pixel that has delayed rising and falling characteristics compared to other colors, generates a large capacitance at the same voltage during driving, and has a large influence on luminance, so that the effect of side leakage current can be prevented.

It will be apparent to those skilled in the art that various modifications and variations can be made in the present disclosure without departing from the spirit or scope of the disclosure. Thus, it is intended that the present disclosure covers such modifications and variations thereto, provided they fall within the scope of the appended claims and their equivalents.

What is claimed is:
1. A display device comprising:
 a substrate including a first light-emitting portion and a second light-emitting portion spaced apart from each other;
 a reflective layer spaced apart from each of the first and second light-emitting portions and surrounding the second light-emitting portion;
 a first light-emitting element including a first light-emitting layer in the first light-emitting portion; and
 a second light-emitting element including a second light-emitting layer in the second light-emitting portion, the second light-emitting layer emitting light having a wavelength different from light emitted from the first light-emitting layer.

2. The display device according to claim 1, further comprising a sensor on a surface opposite to a surface of the substrate on which the first light-emitting portion and the second light-emitting portion are provided.

3. The display device according to claim 2, wherein the reflective layer overlaps the sensor.

4. The display device according to claim 2, wherein the sensor is at least one of an image sensor, an infrared sensor, or an ultraviolet sensor.

5. The display device according to claim 1, wherein the reflective layer is disposed in a bank provided between the first and second light-emitting portions.

6. The display device according to claim 5, wherein the bank comprises:
   a first layer disposed between an anode of the first light-emitting element and an anode of the second light-emitting element; and
   a second layer provided on the first layer and covering edges of the anode of the first light-emitting element and anode of the second light-emitting element,
   wherein the reflective layer is provided between the first layer and the second layer.

7. The display device according to claim 6, wherein an edge of the reflective layer is spaced apart from each of the anode of the first light-emitting element and the anode of the second light-emitting element.

8. The display device according to claim 1, wherein the second light-emitting portion has an emission peak at a wavelength of 500 nm to 600 nm, and
   the first light-emitting portion has an emission peak at a shorter wavelength or a longer wavelength than an emission peak of the second light-emitting portion.

9. The display device according to claim 1, wherein a thickness of the reflective layer is smaller than a thickness of each of the first layer and the second layer.

10. The display device according to claim 1, wherein a cathode of the first light-emitting element is integrated with a cathode of the second light-emitting element, and
    an anode of the first light-emitting element is spaced apart from an anode of the second light-emitting element,
    wherein each of the first light-emitting element and second light-emitting element further comprises at least one common layer between the anode and the first or second light-emitting layer, and between the first or second light-emitting layer and the cathode.

11. A display device comprising:
    a substrate having an active area and a non-active area surrounding the active area, the active area including a first area overlapping a sensor unit and a second area not overlapping the sensor unit;
    a bank defining a first light-emitting portion, a second light-emitting portion, and a third light-emitting portion in each of the first area and the second area, the first light-emitting portion, the second light-emitting portion and the third light-emitting portion being spaced apart from each other; and
    a reflective layer in the bank in the first area, the reflective layer being spaced apart from the first to third light-emitting portions, and surrounding the second light-emitting portion.

12. The display device according to claim 11, wherein an arrangement density of the first to third light emitting portions in the first area is smaller than an arrangement density of the first to third light-emitting portions in the second area.

13. The display device according to claim 11, wherein the first area further includes a transmissive portion.

14. The display device according to claim 11, wherein the second light-emitting portion emits green light.

15. The display device according to claim 11, wherein the sensor unit comprises at least one of an image sensor, an infrared sensor, or an ultraviolet sensor, and is provided on a surface opposite to a surface of the substrate on which the first to third light-emitting portions are formed.

16. The display device according to claim 11, wherein the bank comprises:
    a first layer contacting an outer circumference of an anode of the second light-emitting portion and disposed outside the second light-emitting portion; and
    a second layer covering an edge of the anode of the second light-emitting portion and provided on the first layer,
    wherein the reflective layer is provided between the first layer and the second layer.

17. The display device according to claim 11, wherein the reflective layer comprises a reflective metal or a reflective insulating layer.

18. The display device according to claim 11, wherein one of the first and third light-emitting portions emits red light and the other one of the first and third light-emitting portions emits blue light.

19. The display device according to claim 13, wherein the transmissive portion does not overlap the bank.

20. The display device according to claim 11, wherein the first to third light-emitting portions in each of the first area and the second area comprise:
    a first anode, a second anode, and a third anode spaced apart from each other and having an overlapping edge below the bank;
    a first light-emitting layer, a second light-emitting layer, and a third light-emitting layer provided on the first anode, the second anode and the third anode, respectively; and
    a cathode integrally provided on the first to third light-emitting layers,
    wherein the second light-emitting layer of the first area extends to a part of a top surface of the bank outside the second light-emitting portion and has an edge overlapping the reflective layer.

* * * * *